(12) United States Patent
Chen

(10) Patent No.: US 7,079,310 B2
(45) Date of Patent: Jul. 18, 2006

(54) GAIN-CLAMPED OPTICAL AMPLIFIER

(76) Inventor: Chih-Hsiao Chen, 2F., No.3, Lane 70, Jiangong 1st Rd., Hsinchu (TW)

( * ) Notice: Subject to any disclaimer, the term of this patent is extended or adjusted under 35 U.S.C. 154(b) by 146 days.

(21) Appl. No.: 10/752,672

(22) Filed: Jan. 8, 2004

(65) Prior Publication Data

US 2005/0152026 A1    Jul. 14, 2005

(51) Int. Cl.
*H01S 4/00* (2006.01)
*H01S 5/00* (2006.01)

(52) U.S. Cl. .................. 359/337; 359/344; 359/346
(58) Field of Classification Search ............ 359/344, 359/346, 337
See application file for complete search history.

(56) References Cited

U.S. PATENT DOCUMENTS

| | | | | |
|---|---|---|---|---|
| 4,882,607 | A * | 11/1989 | Shinada | 359/344 |
| 5,184,247 | A * | 2/1993 | Schimpe | 359/344 |
| 5,436,759 | A * | 7/1995 | Dijaili et al. | 359/333 |
| 6,249,373 | B1 * | 6/2001 | Woodward | 359/344 |
| 6,487,008 | B1 * | 11/2002 | Morito | 359/344 |
| 6,512,629 | B1 * | 1/2003 | Dijaili et al. | 359/344 |
| 6,704,138 | B1 * | 3/2004 | Dijaili et al. | 359/344 |
| 6,865,020 | B1 * | 3/2005 | Kim et al. | 359/344 |
| 6,891,664 | B1 * | 5/2005 | DiJaili et al. | 359/344 |
| 2003/0021014 | A1 * | 1/2003 | Barenburg et al. | 359/344 |

OTHER PUBLICATIONS

Tiemeijer, L.F. et al., High-Gain 1320nm Semiconductor Optical Amplifier Modules with a built-in amplified signal monitor for optical gain control, IEEE Photonics Technology Letters, vol. 9, No. 3, pp. 309-311 (Mar. 1997).*

* cited by examiner

*Primary Examiner*—Jack Keith
*Assistant Examiner*—Eric Bolda
(74) *Attorney, Agent, or Firm*—Bacon & Thomas, PLLC

(57) ABSTRACT

An improved gain-clamped optical amplifier is disclosed. A series of laser cavities are placed along the amplifier axis. The laser cavities are designed such that the carrier densities of the amplifier decline toward the signal output end. Since the gain clamping amplitudes at positions along the amplifier can be different, we have the freedom to optimize the optical gain at all location, to minimize the noise impact at the signal input end, and to maximize the saturation output power at the signal output end. In addition, carrier levering effect realized by gain/loss wings further lowers the noise figure, and extends the optical gain and saturation output power. An ideal optical amplifier with high linear gain, small noise figure, and large saturation output power and extended dynamic range is then achieved. Energy saving is the bonus of using the invented amplifiers.

24 Claims, 19 Drawing Sheets

GAIN-CLAMPED OPTICAL AMPLIFIER

BACKGROUND OF THE INVENTION

1. Field of the Invention

The present invention relates to optical amplifiers, and more specifically, to a gain-clamped optical amplifier, which has large linear optical gain, low noise figures, increased saturation output power, and extended input signal dynamic range.

2. Description of Related Arts

Optical amplifiers play important roles in the optical communication industry. One lively example is that the commercial availability of EDFA (Erbium-doped fiber amplifier) triggered the booming growth of communication system bandwidth near 1995. Among all kinds of optical amplifier, EDFA, Raman amplifier and SOAs (Semiconductor Optical Amplifiers) are the three most important ones. EDFA gives us low noise figure and high output power, yet it requires complicated filtering mechanics to flatten its intrinsic non-uniform gain spectrum. The final product of EDFA is costly and bulky. Raman amplifier is also with large size and high cost. It is often used as a complement to EDFA rather than as a discrete amplifier. SOA has the advantages of cost, size and broad spectrum. Yet, its relatively large noise level, smaller saturation output power and non-linear gain characteristics limit its commercial application as optical amplifier.

In summary, an ideal optical amplifier for WDM communication systems should have the following characteristics: effective cost, compact size, linear optical gain, large saturation output power, uniform amplification over a wide spectrum range, fast response time to prevent cross talk at signal add/drop and low noise figure. Many researches have been devoted in solving the above issues. [L. H. Spiekman et al "Recent Advances in WDM Applications of Semiconductor Optical Amplifiers" ECOC, Vol. 1, pp.35–38 (2000)] [E. Desurvire, "Erbium-Doped Fiber Amplifiers: Principles and Applications" New York, Wiley (1994)]

One principle concept to linearize the optical signal gain and resolve the cross talks is to introduce lasing condition into the gain media with the cost of sacrificing optical signal gain. Since the gain of the cavity will be clamped to satisfy the round trip condition of the laser, the carrier density inside the cavity will be kept at that level. If the optical signal amplification path shares the same active region as the laser, the gain of the optical signal is clamped. Under the gain clamping condition, the variation of signal power or signal add/drop will have minimum impacts on the signal gain.

U.S. Pat. No. 5,184,247 discloses a structure having distributed feedback grating along the amplification path. U.S. Pat. No. 5,119,039 suggests wavelength selective filters at the optical signal input and output ends. Both inventions create lasing cavity along the signal amplification axis. Experiments have demonstrated that these inventions did clamp signal gain and extend the saturation output power [L. F. Tiemeijer et al. "1310 nm DBR Type MQW Gain Clamped Semiconductor Optical Amplifiers with AM-CATV-Cable Linearity", IEEE, Photo. Tech. Lett. P.1453–1455 (1996)]. Yet, studies show that the signal noise ratio of the clamped SOA is higher than that of conventional SOAs [D. Wolfson et al., "Detailed Theoretical Investigation of the Input Dynamic Range for Gain-Clamped Semiconductor Optical Amplifier Gates at 10 Gb/s", IEEE, Photo. Tech. Lett. pp1241–1243 (1998)]. Since GC-SOA (Gain-clamped Semiconductor Optical Amplifier) has to allocate some portion of the injected energy to the lasing mode, the carrier inversion of the GC-SOA should be lower than that of conventional SOA, assuming the same injection current density and the same input signal power. The lower carrier inversion at the signal input end will make the signal noise ratio at the signal output end smaller. Studies also show that GC-SOAs have more severe signal distortion at high bit rate than the conventional SOAs. The relaxation time of the longitudinal lasing cavity is not small enough to make the gain clamping mechanism response fast enough to compensate the modulation of the high bit rate signal. In addition, to separate the lasing signal and the amplified optical signal, which are in the same axis, must be added.

U.S. Pat. No. 3,467,906 reveals the possibility of using a transverse lasing field to make the gain independent of pumping current. This invention does not count on the parasitic lasing modes' effect on the gain clamping mechanism. If the laser structure supports multi modes, the parasitic lasing modes may consume a large amount of injected energy and make the signal gain too small to be useful. To solve this problem, U.S. Pat. No. 5,436,759 proposed a segmented off-axis lasing scheme. As the off-axis laser cavities are small enough and optically segmented, the cavities do not support parasitic lasing modes. Thus the off-axis lasing scheme becomes useful to clamp the gain media and still allow the amplifier to provide substantial gain for optical signal. One of the inventors also demonstrated a VCSEL integrated semiconductor amplifier with very small signal cross talk [D. A. Francis et al., "A Single-Chip Linear Optical Amplifier", PD13, OFC 2001].

As to the ASE reduction, the above patent indicates that the amplified spontaneous emission (ASE) power in the amplifier axis will be reduced due to the quantum electron dynamics (QED) of micro cavity. Furthermore, the inventors proposed distributed spatial filters (DSF) along the amplifier axis. They claim that the active optical guiding structure incorporated with DSF can make the gain of ASE smaller than the gain of signal. This is not true. Although the spontaneous emission is random in amplitude, time and spectrum, it is correlated to the structure surrounding the noise source [C. H. Henry, "Phase Noise in Semiconductor Lasers", J. Lightwave Technol. Vol. LT-4, pp.288–297 (1986)] [Chih-Hsiao Chen et al. "Static, Dynamic, and Noise Analysis of Multi-section DFB Lasers Using Frequency Domain Transmission Line Model", IEEE, J. Quantum Electron. Vol.34, No.9, pp1533–1544 (1998)]. Spontaneous emission generates evanescent modes and guided modes of the structure. The ASE we care about comes from the guided modes. Since evanescent modes are not supported by the waveguide, it is not amplified along the amplifier. The guided ASE has the same spatial contents as the guided amplified signal. Thus, spatial filter will not filter out the ASE from the guided photons. The ASE and signal sees similar gain and loss along the amplifier axis. If one shorten the guiding section and introduce diffraction regions as the above patent suggests, guided amplified signal will face the same loss as the ASE does.

U.S. Pat. No. 5,604,628 proposes a structure integrating an off-axis laser and an absorber region at the output end of an optical laser amplifier. The power of the laser was modulated by the amplified input signal. The inventors use this structure as a signal regenerator with filtered spontaneous emission. Even though the inventors do not mention, this device can be used as wavelength converter. The purposes of this invention are neither using the amplified signal power, nor increasing the saturation output power, nor providing linear gain of the SOA.

U.S. Pat. No. 5,604,628 suggests a two section SOA separated by a passive waveguide. This invention plays with the injection current of the two amplifier sections. The injection current of the first amplifier section, which is closer to the signal input end, is adjusted to provide a constant input power to the second section amplifier. The second section of amplifier is injected with a high current level to keep saturation output power large. Nevertheless, since gain-clamping mechanism is not utilized, the optical gain of this invention is not linear and the saturation output power is low compared with GC-SOAs.

In summary of the prior arts, the optical gain and signal noise ratio have to be sacrificed to obtain linear power gain and high saturation output power. And the ASE issue is not effectively solved. The invention rises from the following two questions. There exists a need to minimize the scarification, while still get linear signal gain. In addition, it is desirable to reduce spontaneous emission amplified along the amplifier axis.

SUMMARY OF THE INVENTION

It is an object of the present invention to provide an optical amplifier having a large and linear optical gain.

It is another object of the invention to provide an optical amplifier with low noise figure. It is a further object of the invention to provide an optical amplifier with increased saturation output power. It is still another object of the invention to provide an optical amplifier with extended input signal dynamic range.

It is still a further object of the invention to provide an optical amplifier, which can reduce multi-channel signals cross talk.

It is still a further object of the invention to provide an optical amplifier, which can reduce time domain cross talk and inter-symbol interference.

It is still a further object of the invention to provide an optical amplifier, which can save energy from the clamping lasing modes and reduce the bias and heat dissipation requirement.

It is still a further object of this invention to provide an optical amplifier, which has extended the saturation output power while maintain a high-speed response time.

It is another object of this invention to provide a process, which realize devices in accordance with the present invention.

In accordance with an aspect of the present invention, an optical amplifier comprises a plurality of in-axis laser cavities disposed along the amplifier axis, wherein the laser cavities share the gain regions of the optical amplifier. The laser cavities are disposed so that the optical gain of the optical amplifier declines from an input end toward an output end of the optical amplifier.

In accordance with another aspect of the present invention, an optical amplifier comprises a plurality of off-axis laser cavities disposed along the amplifier axis, wherein the laser cavities share the gain regions of the optical amplifier. The laser cavities are disposed so that the optical gain of the optical amplifier declines from an input end toward an output end of the optical amplifier.

The basic concepts behind this invention are as follows. First, the most critical geometric region to maintain linear optical gain and high saturation power is at the signal output end of the optical amplifier. If the signal photon density is larger than certain level, the lasing condition may be turned off and gain clamping no more exists, and optical gain starts to decrease with larger signal power. Second, the most important geometric region to keep the noise level low is the signal input end, since the spontaneous emission generated here will experience almost the full gain of the amplifier. Third, it is not necessary to make optical gain geometrically uniform to keep the gain of the amplifier linear. As long as the local gains along the amplifier axis are clamped, even though they are at different levels, the optical gain of the whole amplifier is clamped. Last, the major benefit we obtain from lower local carrier density is the higher saturation output power, and we have to sacrifice noise figure and signal gain in return. We should minimize the scarification and make local saturation output power just above the possible local signal power.

This invention starts with design principles to achieve the above objects of improving optical amplifier characteristics. The embodiments of this invention are various kinds of amplifiers, which fulfill the design principles. The generic amplifier comprises a series of in or off axis laser cavities placed along the amplifier axis. The laser cavities share the gain regions of the optical amplifier. The gain regions can be semiconductor bulk material, quantum wells, pumped doped fibers, Ti-sapphire or any other optical gain material. In addition to the shared gain region, the laser cavities may have their own off axis loss/gain regions. The designs of the local laser cavities can be different at different positions.

The prime design principle of this invention is to maximize the local carrier densities of the shared amplifier gain material, and have the local saturation photon densities just above the possible local signal photon densities. Designer should take effects of standing wave and tapered amplifiers into consideration. Since the optical signal is amplified along the amplifier axis, basically, we should make the carrier density distribution of the amplifier gain material decline toward the signal output end of the amplifier.

This arrangement provides several benefits. First of all, the noise figure of the amplifier can be reduced. Since the noise signal will be amplified along the amplifier axis, the noise figure near the signal input end has the greatest impact on the noise figure of the whole amplifier. Noise figure of amplifier segment is in fact a function of carrier inversion. The higher carrier inversion is, the lower noise figure is [Y. Yamamoto, "Noise and Error Rate Performance of Semiconductor Laser Amplifiers in PCM-IM Optical Transmission Systems", IEEE J. Quantum Electron. Vol.16, pp.1073–1081 (1980)]. By the arrangement of declining carrier density, total noise can be reduced.

The second advantage of this arrangement is that the optical gain can be larger than the conventional gain clamped amplifiers, which have uniform design of laser cavities. By solving rate equations, we know that saturation output power is inverse proportional to the signal gain. In conventional gain clamped semiconductor optical amplifiers, the local optical signal gains are almost uniform. The design of conventional gain clamped semiconductor optical amplifiers is in the dilemma of either sacrificing the amplifier gain or enduring a small saturation output power. The local gains and carrier density at positions far away from the signal output end are unnecessarily small, because the signal power increases toward the signal output end. Assuming the shared gain region is pumped by a constant carrier injection rate, lower carrier density means a larger portion of injected energy is assigned to laser modes. It results in less energy allocated to the gain of signal. In this invention, the declining carrier densities match the inclining optical power. Pumping energy is saved from the lasing modes, and results in a larger integrated gain of the whole amplifier.

The third advantage of this arrangement is that the saturation output power is larger. Without the design dilemma enforced by uniformly local carrier densities, designer can make the saturation output power large; yet have large local signal gains at positions closer to the signal input end. The gain of the whole amplifier is the integration of all local gains along the amplifier axis. Larger saturation output power is then achieved without sacrificing signal gain and noise figure.

The forth advantage of this arrangement is that the dynamic range of the amplifier is extended. The dynamic range of an amplifier is determined by the saturation output power at the higher limit and the minimum input signal required to keep an acceptable extinction ratio. Combining the above three advantages, amplifiers of this invention have extended input signal dynamic range.

Energy saving is the fifth advantage of this arrangement. Since minimum injected energy is assigned to the lasing modes, amplifiers of this invention consume much less power compared with the conventional gain clamped optical amplifier. Energy saving opto-electronic components generate less heat, have longer lifetime, simplify the packaging requirement to dissipate heat, and ease the system design to provide higher power.

There are several ways to achieve the above design principle. For amplifiers integrated with in-axis laser cavities, a series of gratings are placed along the amplifier axis. Gratings create distributed feedbacks of light and form local cavities. First, we can let the distributed optical feedback strength increases toward the signal output end. Increasing the grating amplitude or increasing optical confinement near the grating region can achieve this. As the distributed optical feedback mechanism is strengthened, the clamping mechanism is stronger and carrier density becomes smaller. Second, we can adjust the grating pitches and make the local lasing frequency more aligned to the peak of material gain spectrum at position closer to the signal output end. Since the local lasing wavelengths near the amplified signal output end are closer to the peak of material gain spectrum, less carrier densities are required to make local cavities oscillate.

As to the off-axis versions of gain clamped amplifiers, first, we can design the cavity mirror reflection. The less power cavity mirrors reflect, the higher gain and carrier inversion are clamped to compensate the mirror loss and keep the cavity lasing.

Second, we can choose wavelength dependent mirrors, and design the wavelength difference between the mirrors' maximum reflection wavelength and the material gain's peak spectrum. As the maximum reflection wavelength is off from the material gain peak spectrum, the cavity lasing frequency will be forced to deviate from the material gain peak region. The required carrier inversion is increased to maintain the round trip condition of laser.

Third, a series of off-axis laser cavities whose transverse areas incline toward the signal output end are replaced next to the amplifier axis. More modes are supported by larger transverse area. Laser cavity with larger transverse area require smaller carrier density to oscillate. Thus, gain will be clamped at a lower level. By this arrangement, we can make the carrier density distribution decline toward the signal output end.

Forth, we can introduce additional loss material in the laser cavities. The loss regions can be passive diffractive layers, active electro-absorption materials with or without bias, or any other loss material. The introduced loss regions are away from the amplifier axis, such that the optical signal gain is not reduced. We denote the introduced loss materials as loss wings. As the loss wings are inserted in the laser cavity, higher carrier density of the in-axis gain region is required to maintain lasing condition. Local loss wing laser cavities give us larger local signal gains and smaller noise figures.

Fifth, instead of loss material, additional gain material can be inserted as gain wings. Gain wings are off amplifier axis to contribute gain for the lasing modes, and not shared by the amplified signal. Gain wings can be pumped by the same carrier injection system as the amplifier gain region, or by its own pumping system. Gain wings can reduce the required gain in the in-axis region to meet the round trip condition of the cavity. Thus the saturation photon density, which is inverse proportional to the gain coefficient of amplifier material, can be increased. If the in-axis gain regions and the gain wings are energized by the same pumping system, it is difficult to make the gain coefficient of the two categories of gain regions different too much. Although the gain coefficients of the above two regions are correlated by the round trip condition of lasers and the rate equations of all gain regions, the carrier density at the gain wings can be very high, if we have higher carrier injection rate into the gain wings. Therefore, the gain coefficient of the in-axis material can be suppressed and the saturation photon density is extended. The function of loss wings and gain wings denote carrier density levering effect.

Either the loss wing or gain wing designs may make the lasing cavity too long and reduce the response speed for time domain signal perturbation or add/drop. The sixth design is to resolve this issue by introducing another system of clamping laser cavities, which have very short cavity lengths, for example, micro cavity lasers or VCSELs. The loss wings or gain wings determine the static clamped carrier densities, yet short cavity lasers are in charge of the dynamic responses. This design enables the amplifier with very high local gain or very large saturation output power to have fast dynamic response to avoid time domain signal cross talks and inter-symbol interference.

In addition to the above device designs, this invention includes methods to form off-axis reflection variable mirrors for semiconductor optical devices. To create wavelength selective mirrors with reflection spectrum varying along the amplifier axis, one can sequentially grow the mirrors, etch away sections, and re-grow new mirror structures. This etch-and-regrow technique has reflective loss at the butt-coupled interface, and becomes much more difficult as the number of mirror pairs increases. In addition, devices using this multi-regrowth technique have low yield. Here, we suggest using selective area epitaxy [R. Bhat, "Current Status of Selective Area Epitaxy by MOCVD", J. Cryst. Growth Vol. 120, pp.362–368 (1992)] to replace the above tedious approach. Selective area epitaxy is an increasing prevalent approach in semiconductor integrated optics devices. Epitaxy layers are grown on partially masked or partially etched substrates. This technique allows engineers to control local layer thickness, and thus the band-gap, of multi-quantum well structures with no layer discontinuity. As the multiplayer DBR structures are used as off-axis mirrors, one can use selective area epitaxy technique to locally define the thickness of DBR layers. The reflection spectrums of local DBRs, which are determined by the layers thickness, are then under control.

To create mirrors with reflection amplitudes varying along the amplifier axis, one can grow uniform DBR layers and sequentially etch few layers from regions. The number of DBR layers left determines the reflection amplitude. This technique has interface reflective loss, low production yield, and becomes complicated as the number of mirror pairs increases. Here, we suggest using selective area etch [T. Brenner et al., "Local etch rate control of masked In/In-GaAsP by diffusion limited etching", J. Electrochem. Soc. Vol. 141, pp.1954–1956 (1994)] to replace the above multi-etch approach. Selective area etch is usually used to fabricate vertically tapered optical beam adapters of semiconductor optical devices. Masks covered on a semiconductor surface can control its local wet etching rate. One can grow uniform DBR layers and use selective area etching technique to define the number of local DBR layers, and control the local mirror reflection amplitude.

DETAILED DESCRIPTION OF THE INVENTION

Figure 1:
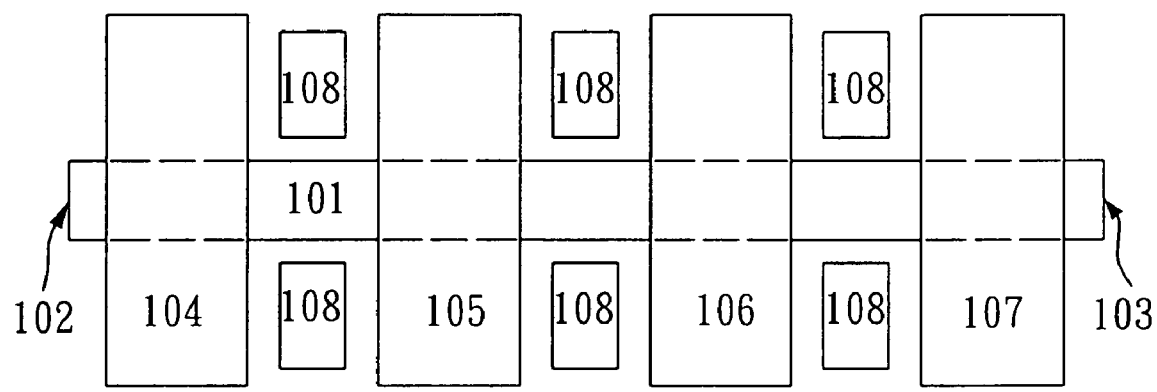
FIG. 1 shows a generic device with a series of laser cavities. The laser cavities are designed such that the clamped carrier populations of the amplifier axis incline toward the output end.

The general device configuration of an optical amplifier in accordance with the present invention is shown in FIG. 1. The optical amplifier shown in FIG. 1 comprises a gain medium 101, which has a waveguide, for amplifying optical signal along the amplifier axis of the gain medium 101, with input facet 102 for coupling optical signal into the gain medium, and output facet 103 for amplified optical signal output. The guiding can be achieved in many ways, such as index guiding, gain guiding, tapered structures, optical fiber, not limited by the above mentioned. Laser cavities 104 to 107 are placed along the amplifier axis. The number of the laser cavities is not necessary to be four, instead, it can be any proper number depending on design. The axis of laser cavities 104 to 107 can be arranged in or off the amplifier axis of the gain medium 101. The laser cavities 104 to 107 can be placed next to each other, or separated by spacers 108, which can be optical opaque segments as shown in FIG. 1, to prevent lasing modes cross talks between adjacent laser cavities. The laser cavities 104 to 107 share parts of the gain material of the amplifier, however, they may have their own loss or gain region placed outside the amplifier axis. Facets 102 and 103 can be coated by anti-reflection coating, be angled to the guiding axis, have window regions, or have integrated or extra optics to prevent reflection and to enhance signal coupling in and out of the device to possible external waveguides. As local laser cavities are biased above threshold, the local carrier densities are clamped. Since the optical signal is amplified along the amplifier axis of the gain medium 101, the signal photon density is increased toward the signal output end. The device is designed such that the carrier densities of the gain material are clamped at higher levels at position with higher local photon density, basically declining toward the signal output end. Standing wave effect caused by residue reflection of facets 102 and 103 can also be taken into design consideration. As the carrier densities of gain material 101 closer to the signal input end 102 (e.g. the portion of the gain material corresponding to cavities 104 and 105) have higher population, the local noise figures are lowered and local signal gain coefficients are higher. The noise level at signal input end has strongest impact to the noise figure of the whole device. By reducing the noise level closer to the signal input end, the noise figure of the amplifier is reduced. As to the gain material closer to the signal output end 103, larger saturation output powers are obtained by clamping the carrier population of amplifier gain material within cavities 106 and 107 at lower levels. Since the carrier densities along the whole axis are locally clamped, the optical gain of the whole device is linear. Regardless of the low signal gain near the signal output end, the optical gain of the whole device, which is the integration of all local gains, is large. Due to smaller noise figure and larger saturation output power, the dynamic range of the amplifier is extended.

Figure 2:
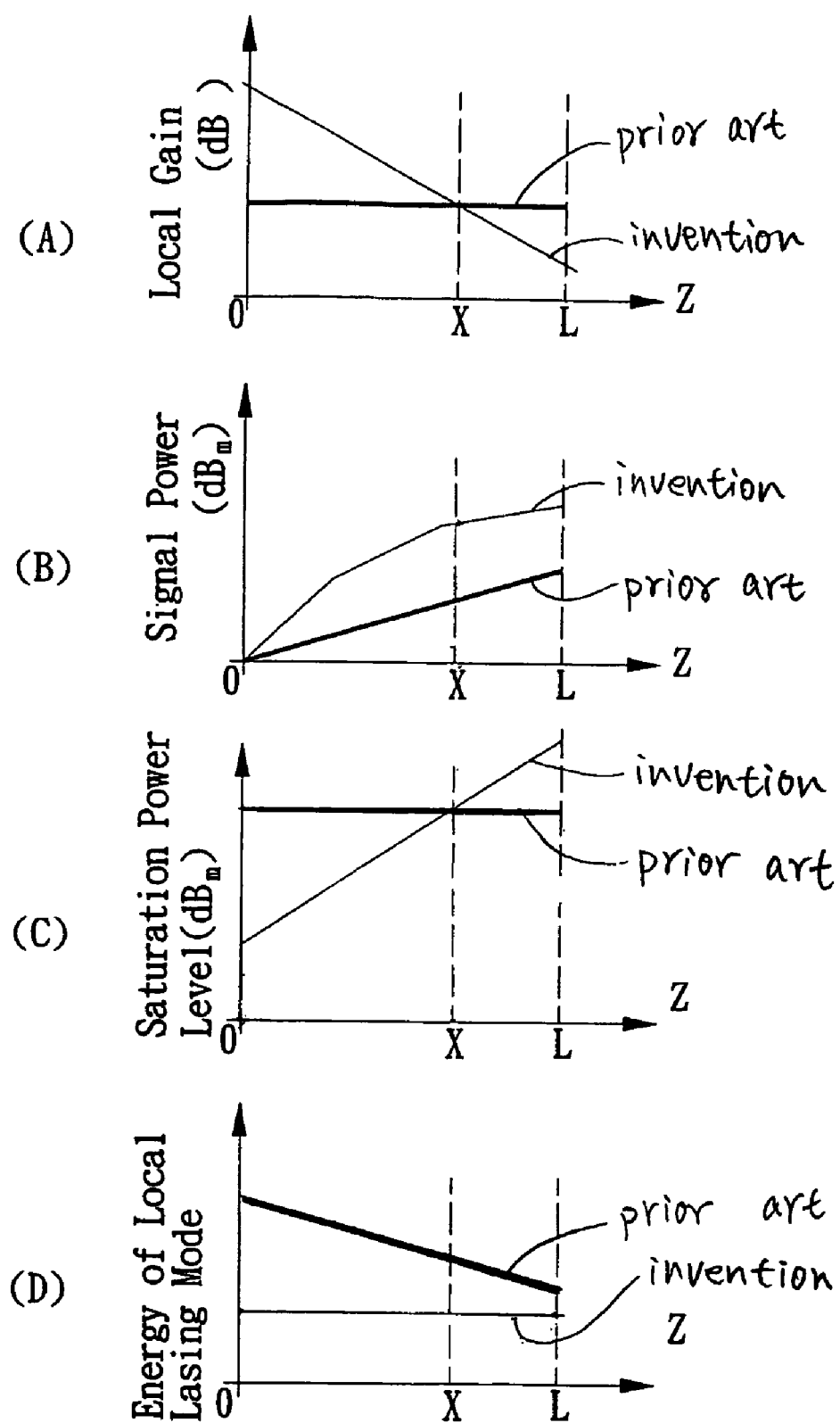
FIG. 2A shows the conceptual local gain profiles of the conventional gain-clamping optical amplifier and this invention.
FIG. 2B shows the conceptual local power profiles of the conventional gain-clamping optical amplifier and this invention.
FIG. 2C shows the conceptual local saturation power profiles of the conventional gain-clamping optical amplifier and this invention.
FIG. 2D shows the conceptual local laser energy profiles of the conventional gain-clamping optical amplifier and this invention.

Shown in FIGS. 2A–D are the characteristic comparisons between the conventional gain-clamped optical amplifiers and optical amplifiers of this invention. These conceptual figures can be easily confirmed by solving laser round trip conditions and carrier rate equations. In FIG. 2A, local signal gains along the amplifier axis are shown. The carrier densities of conventional gain clamped optical amplifiers are uniformly clamped, and result in a uniformly local gain. However, the carrier densities and local gains of the invented optical amplifiers are clamped in levels declining toward the signal output end. To obtain a higher saturation output power, the local gains closer to the output end are less than those of conventional GC-OA. It is worthy to remind that the total signal gain is the integration of all the local gains. Thus, the overall signal gains of the invented optical amplifiers are larger than those of conventional GC-OAs. This fact is illustrated in FIG. 2B. At signal injection end, the signal grows faster compared to the conventional GC-OA, due to higher local gains. Although the signal sees less optical gain at the output end, the final signal output power is larger than that of conventional GC-OAs. In fact, the maximum signal output power is limited by the saturation output power at the output ends. FIG. 2C shows the local saturation power along the amplifier axis. The local saturation power is inversely proportional to the signal local gains. Although the saturation power levels close to the signal input end are smaller than those of conventional GC-OAs, the local gains are still clamped due to small signal power level at these regions. FIG. 2D shows the energy allocated to the local lasing modes. The injected carriers contribute to the gain of the input signal and to the power of lasing modes. In conventional GC-OAs, large portion of the injected carriers closer to the signal input end are assigned to the lasing modes due to smaller local gain compared with optical amplifiers of this invention. Even at position X, where the local optical gains of the two kinds of devices are equal, conventional GC-OAs still pay more to local lasing modes, because of the smaller local signal power. Contrast to the conventional GC-OAs, we design the local saturation power just above the possible local signal level. It results in a low level of lasing modes along the amplifier axis.

Figure 3A:
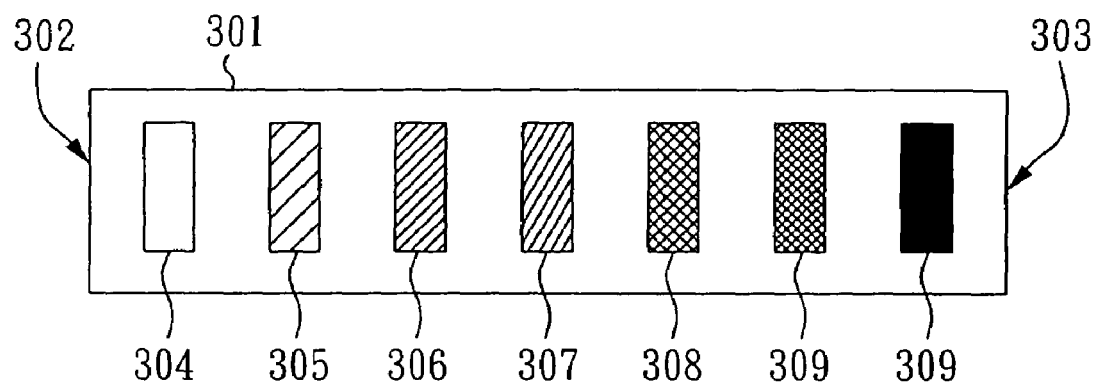
FIG. 3A shows a generic optical amplifier with a series of in-axis laser cavities. The strength of distributed feedback reflections incline toward the output end.

FIG. 3A shows an embodiment of the optical amplifier in accordance with the present invention. The optical amplifier comprises a series of in-axis laser cavities. Gain medium 301 comprises a waveguide, with signal input end 302 and output end 303. Grating materials, 304 to 310, forms local longitudinal laser cavities. The pitch of the gratings is in the magnitude order of wavelength. For simplification, only a few of the gratings are shown. In practice, the number of gratings can be very large. Grating can be created by material optical index difference or structure discontinuity. Larger index difference or structure discontinuity gives us stronger optical reflection, which is stronger distributed feedback for gratings. In addition, stronger distributed feedbacks make the gratings oscillate at lower threshold current, thus the local cavities clamp carrier densities at lower level, if biased above threshold. In FIG. 3A, grating material closer to the signal output end have larger index difference or structure discontinuity, thus the local carrier densities decline toward that end.

Figure 3B:
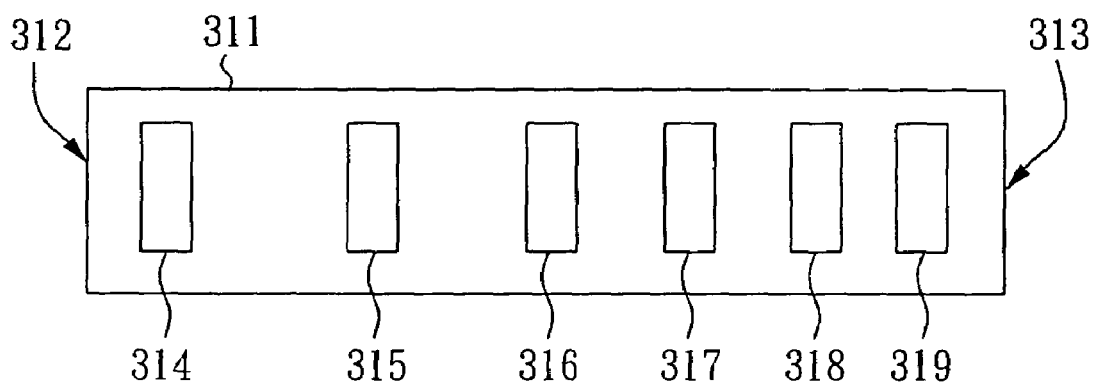
FIG. 3B shows a generic optical amplifier with a series of in-axis laser cavities. The periods of distributed feedback reflections vary to make the local oscillation wavelength closer to the signal output end more match to the peak of material gain spectrum.

FIG. 3B shows another embodiment of the optical amplifier in accordance with the present invention. The optical amplifier has a series of in-axis laser cavities, which are implemented by grating materials 314 to 319. Numeral 311 indicates the optical amplifier material with beam guiding function. 312 and 313 indicate the signal input and output facets, respectively. The index difference or structure discontinuities of grating materials, 314 to 319, are the same. However, the pitches of distributed feedback reflections vary, so that the local oscillation wavelength closer to the signal output end more matches to the peak of material gain spectrum. In this embodiment, the pitch between the grating materials is decreased from the signal input end to the output end. However, the pitches closer to the signal input end are not necessarily to be larger than the pitches near the output end. The grating materials and the pitches can be properly selected. That is, any arrangement can be adopted to make the local oscillation frequency at the output end closer to the peak of material gain spectrum than that at the input end, so that carrier densities are clamped at lower level at the output end.

Figure 4A:
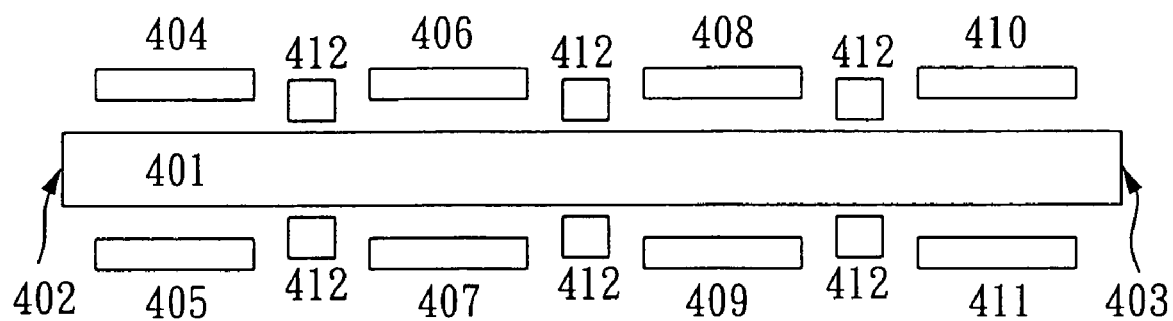
FIG. 4A shows a generic optical amplifier with a series of off-axis laser cavities. Blocking regions separates mirrors pairs. The mirror pairs are designed such that the Q factors of the laser cavities incline toward the output end.
Figure 4B:
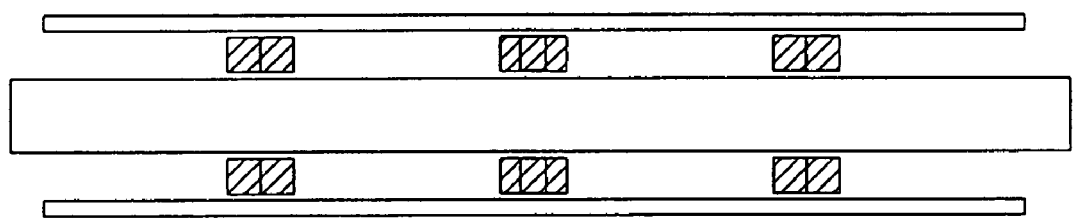
FIG. 4B shows a generic optical amplifier with a series of off-axis laser cavities. The mirrors pairs connect to adjacent ones. The mirrors are designed such that the Q factors of the laser cavities incline toward the output end.

FIGS. 4A–D show the structures of embodiments that provide optical amplifiers with off-axis lasing cavities. In FIG. 4A, the optical amplifier comprises gain material 401 having waveguide with signal input and output facets 402 and 403. Laser mirrors, 404 to 411, which are two-dimensional mirrors or 3-dimensional ring structures, are arranged beside the gain material 401. The optical blocking spacer 412 is placed between laser cavities defined by the laser mirrors to prevent lasing mode cross talk and to suppress unwanted parasitic modes. The reflection indexes of the laser mirrors 404, 406, 408 and 410 are different. The reflection indexes of the laser mirrors 405, 407, 409 and 411 are different. The apertures of laser cavities defined by the blocking spacer or differences between the laser mirrors have the same size. The distance between the amplifier axis and different mirrors pairs 404 and 405, 406 and 407, 408 and 409, 410 and 411 may vary. Reflectivities of the two mirrors of one mirror pair do not need to be the same. The mirror pairs can be separated from each other by blocking material 412 or adjacent to each other, as shown in FIG. 4B. The mirrors can be wavelength selective or non-selective, including dielectric, semiconductor interfaces, metal or distributed Bragg reflectors (DBR), etc, not limited to the mentioned. It is the product of reflections of one pair of mirrors, for example 404 and 405, which determine Q factors of laser cavities. In the case of wavelength non-selective mirrors, cavities oscillate at the peak wavelength of the gain material spectrum. The products of reflections of mirror pairs are designed to incline toward the signal output end. Again, standing wave effect can be taken into design consideration. Thus the local carrier density of the amplifier gain material declines toward the signal output end. In the case of wavelength selective mirrors, the cavities oscillate at wavelength between the peak of the reflectivity spectrum and the peak of the material gain spectrum. If the lasing wavelength is away from the peak wavelength of the material gain spectrum, higher carrier inversion is required to maintain the gain coefficient of the shared active region which makes the cavity round trip condition unity. The device is designed such that the mirror pairs closer to the signal output end has maximum reflection wavelength more matches to the peak wavelength of the amplifier gain spectrum. In this way, the local carrier density of the amplifier gain material declines toward the signal output end.

Figure 4C:
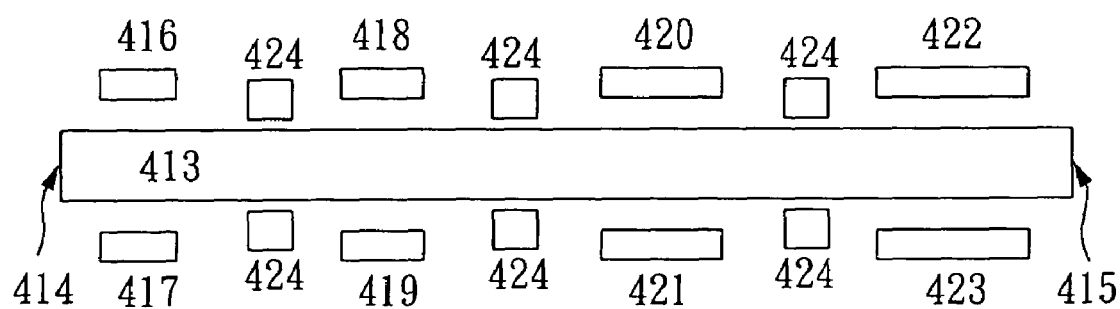
FIG. 4C shows a generic optical amplifier with a series of off-axis laser cavities. The laser apertures of the laser cavities incline toward the output end.

In FIG. 4C, gain material 413, input/output facets 414/415, and optical opaque region (blocking spacer) 424, have the same features as described in FIGS. 4A and 4B. Instead of varying the reflection along the amplifier axis, the reflection products of all laser mirrors pairs, 416 and 417, 418 and 419, 420 and 421, 422 and 423, are the same. In addition, the mirrors can be either wavelength dependent or independent. In this embodiment, the diameters of the laser apertures increase toward the signal output end. That is, the mirror sizes of the laser mirrors are different. The mirror approaching the output end most has the largest mirror area. The more the mirror approaches the output end, the larger mirror area it has. More laser transverse modes are supported by larger aperture cavities, and result in lower threshold current and lower clamped carrier density.

Figure 4D:
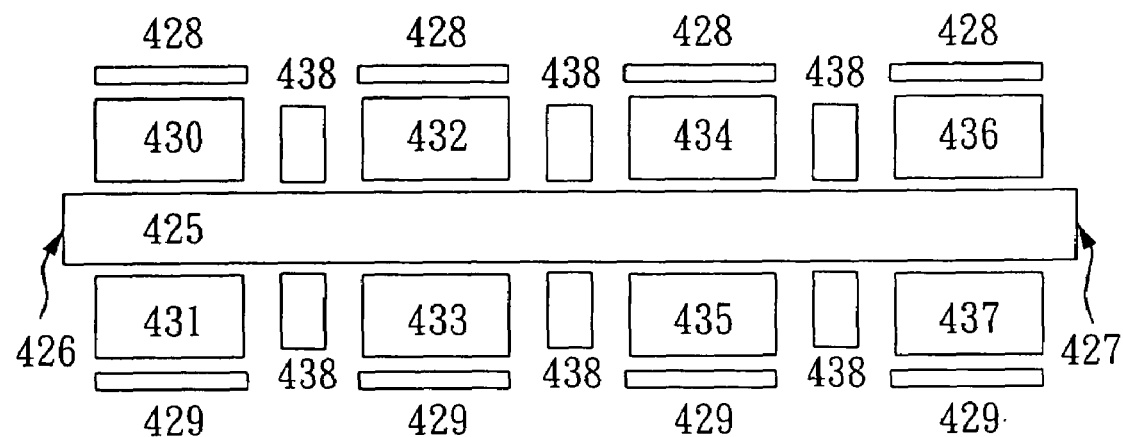
FIG. 4D shows a generic optical amplifier with a series of off-axis laser cavities comprising gain/loss wings in the cavity.

FIG. 4D shows a further embodiment. In FIG. 4D, gain material 425, input/output facets 426/427, and optical opaque region 438, have the same features as described in FIGS. 4A and 4B. Mirror pairs, 428 and 429, of different laser cavities can have the same properties.

Active regions, 430 to 437, which may be gain or loss media, are placed between amplifier gain material 425 and laser mirrors 428/429. These off-axis active regions denote gain/loss wings. Distances between gain/loss wings and gain material 425, or sizes of the gain/loss wings, or gain/loss coefficients of the gain/loss wings can be all different.

Loss wings can be diffraction structures, filters, absorptive materials with or without bias, or any other material/structures capable of reducing the lasing mode power. One can design the diffraction strength, absorptive material shape or bias to control loss coefficients of loss wings. Additional loss coefficients will be introduced to the amplified optical signal, if the loss wings are placed too close to the amplifier waveguide. Distance between loss wings and gain material 425 should be large enough to prevent unnecessary optical signal gain reduction. If local clamping lasers are biased above threshold, the corresponding loss wings with larger loss coefficients will cause larger losses for lasing modes. And the corresponding local carrier densities are clamped at higher level to satisfy the oscillating condition of the lasing cavities. Thus, higher local linear gain and larger local SNR can be achieved.

Gain wings can be any materials capable of amplifying optical beams. Gain coefficients of gain wings may be adjusted by electrical bias, optical pumping or any other means. Since both gain material 425 and gain wings have positive gain coefficients, they may share the same carrier-pumping system. Yet, to ensure larger carrier density levering effect, larger carrier density difference between the gain wings and gain material 425 is necessary. Thus, independent pumping systems for gain wings are preferred. One can easily find the relation between the carrier densities of the two regions by solving cavity round trip condition and carrier rate equations. If gain wings are placed too close to the gain material 425, they will act like part of the gain material 425. Distance between gain wings and the gain material 425 should be large enough to secure necessary levering effect for signal gain. If local clamping lasers are biased above threshold, the corresponding active wings with larger gain coefficients will create larger gains for lasing modes. And the corresponding local carrier densities are clamped at lower level to satisfy the oscillating condition of the lasing cavities. Thus, larger saturation power can be achieved. To create a decline local carrier density profile toward the signal output end, one should design gain or loss wings with incline gain coefficient or decline loss coefficients toward the signal output facet.

Gain wings or loss wings allow us to further extend the optical gain or saturation power level. Although gain/loss wings provide good carrier levering effect, however, the utilization of gain/loss wings makes it difficult to reduce the cavity sizes. Larger cavity size make photon lifetime longer but delay the response to time domain signal perturbation, like add/drop cross talks and inter-symbol interference.

Figure 4E:
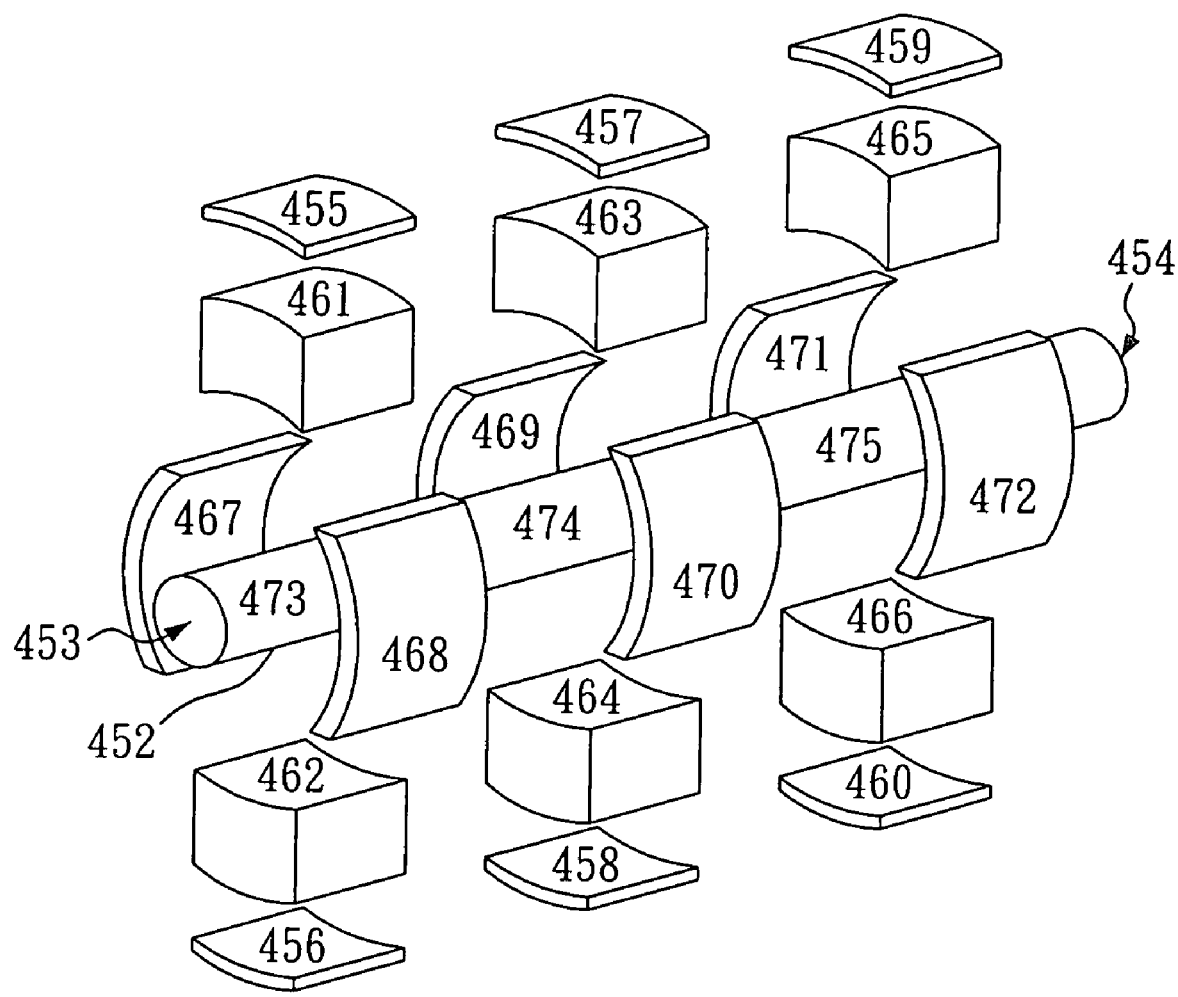
FIG. 4E shows a generic optical amplifier with double clamping mechanism. It has the advantage of carrier levering flexibility and fast response time to signal perturbation.

FIG. 4E shows a double clamped optical amplifier, which provides both carrier levering flexibility and fast response time. Amplifier gain material, 452, with signal input/output facets 453 and 454, are clamped by two series of off-axis laser cavities. Laser mirrors 455 to 460 compose large cavities between the amplifier axis of the gain material 452 and mirrors. Gain/loss wings 461 to 466 are inserted in the large cavities, respectively. These large cavities with loss or gain wings inserted therein can lever the local carrier densities to higher or lower levels. Laser mirrors 467 to 472 of another gain clamping system are very close to the amplifier axis and no additional wings are inserted therebetween. These cavities are very narrow and have very large relaxation oscillation frequency. The carrier density profile of the amplifying gain material 452 is determined by clamping cavities surrounding it. For example, carrier density at position 473 is decided by laser cavities defined by the gain material 452 and the mirrors 455/456 and 467/468, carrier density at position 474 is decided by laser cavities defined by the gain material 452 and the mirrors 457/458 and 469/470. The rest can be deduced accordingly.

Reflectivities of mirrors 455 to 460 and 467 to 472 do not need to be the same. The gain/loss coefficients of gain/loss wings can be all different or even actively adjusted. One can regulate the carrier density profile by controlling the gain/loss coefficients of gain/loss wings. The carrier response time of clamped carrier densities are decided by the narrowest clamping cavities surrounding the corresponding amplifying media. For example, the clamping action time at position 473 is determined by the resonant speed of cavity defined by mirrors 467/468. During the clamping condition, lasing modes of narrow cavities respectively defined by the gain material 452 and the mirrors 467/468, 469/470 and 471/472 will compensate time domain amplified signal perturbation.

To prevent gain saturation and signal distortion, smaller carrier density is required for larger signal powers. If one optical amplifier is used to provide larger linear gain and large saturation output power with small SNR, one should clamp carrier density profile just below the critical level of allowing linear gain for the corresponding local optical signal powers. If one optical amplifier is used as a signal equalizer to provide constant optical output power for different input signal levels, one should adjust the linear gain for different input signal power levels. For both application categories, techniques capable of monitoring local or whole profile of optical signal levels are very useful.

Figure 5A:
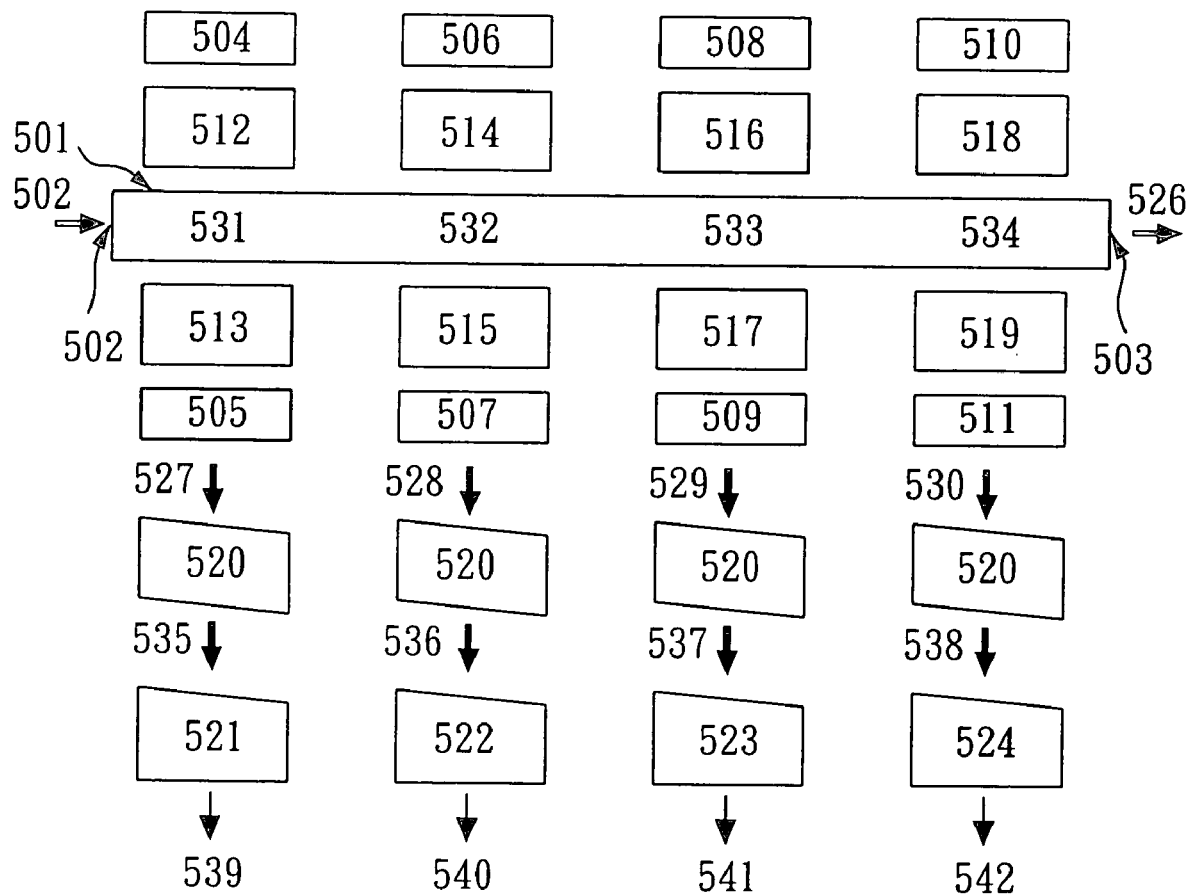
FIG. 5A shows a power monitor scheme of cross-cavity gain clamping optical amplifier.

FIG. 5A shows a power monitor scheme of cross-cavity gain clamping optical amplifiers. In FIG. 5A, 501 is optical signal amplifying gain material, 502 and 503 are optical signal input and output ends, respectively. At least one cross-cavity gain clamping laser system surrounds gain media 501. 504 to 511 are laser mirrors of one clamping laser system. Mirrors 504, 506, 508 and 510 may have high reflectivities to increase possible laser power emitting from mirrors 505, 507, 509 and 511. Gain/loss wings 512 to 519 are optional. Optical amplifiers 520 are used to amplify laser powers to increase the monitor currents 539 to 542. 521 to 524 are optical power detectors for receiving optical powers 527 to 530 from clamping cavities or optical powers 535 to 538 from optical amplifiers. Power receiving facets of optical amplifiers 520 and optical power detectors 521 to 524 may not be perpendicular to laser power incident direction to prevent power reflected back to the clamping cavities. 525 and 526 indicate the input and output optical signals, respectively. As local cavities are biased above resonant threshold, local carrier densities of 501 are clamped. Take one clamping laser for example, carrier density at 531 is clamped as laser cavities defined by mirrors 504/505 resonate. The carrier density is independent to signal power level if the linear gain is not saturated. However, laser power 527 emitted from the mirror 505 is getting smaller as the signal power is getting larger, and vice verse. Laser power 527 is an inverse signature of local signal power at portion 531 of the gain material 501. Detector 521 generates photon current 539. The photon current 539 gives us the information of signal power level at portion 531 of the gain material 501. Similarly, photon current 540 indicates the signal power level at portion 532, 541 indicates the signal power level at portion 533, and so on. At least one of these power index photo-currents 539 to 542 can be used to monitor optical signal power levels.

Figure 5B:
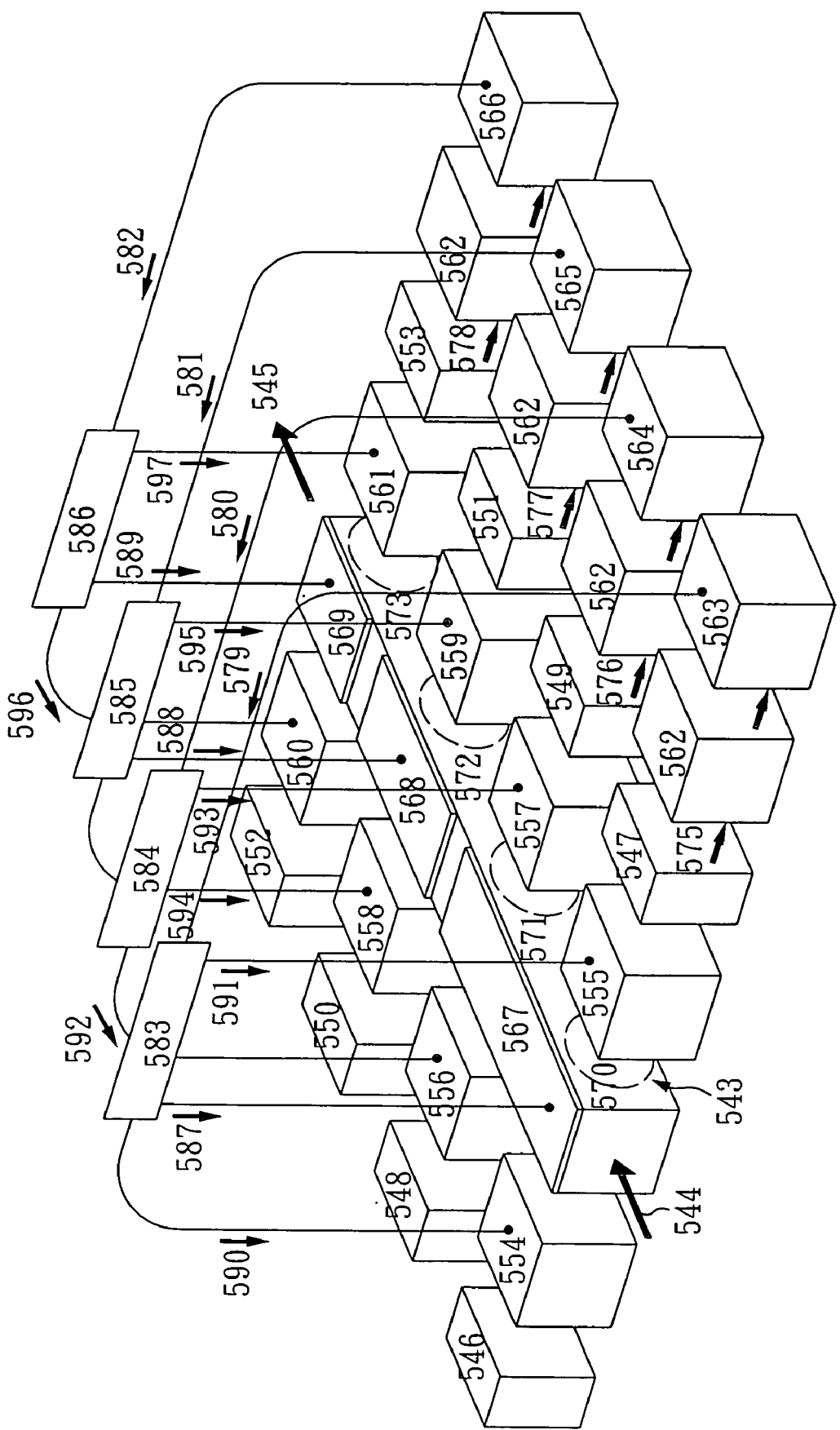
FIG. 5B shows a schematic description of using the power monitoring photo-currents in FIG. 5A to control optical amplifier.

FIG. 5B shows schematic description of using the above-mentioned power monitoring photo-currents to control optical amplifier. Amplifying gain material 543 is surrounded by at least one cross-cavity gain clamping laser systems. Gain material 543 has at least one carrier pumping electrodes 567 to 569 placed along the waveguide, which can be pumped by electrical or optical power or any other type of energy transform, and these pumping electrodes can be controlled by external signals 587 to 589. Multiple pumping electrodes for an optical amplifier provide large freedom to control the profile of local carrier density. 544 and 545 are input and output optical signals, respectively. 546 to 553 are laser mirrors of clamping lasers. Laser mirrors 546, 548, 550 and 552 may have high reflection to increase possible laser power emitting from mirrors 547, 549, 551 and 553. The gain/loss coefficient of active wings 554 to 561 can be controlled by external signals 590 to 597. Optical amplifiers 562 may exist to amplify power index optical signals 575 to 578. 563 to 566 are optical power detectors to receive laser powers from clamping cavities or optical amplifiers 562. As local cavities are biased above resonant threshold, local carrier densities of the gain material 543 are clamped. Clamping laser power 575, 576, 577 and 578 are inverse signatures of local signal powers at the corresponding positions 570 to 573 of the gain material 543. Photo detectors 563 to 566 receive power index optical signals and generate photon current 579 to 582 accordingly. Control circuits 583 to 586 have output channels 587 to 589 to control pumping levels of 567 to 569, and/or output channels 590 to 597 to control the gain/loss coefficients of gain/loss wings 554 to 561. Using information carried by power monitoring currents 579 to 582, control circuits 583 to 586 adjust the above mentioned output channels. Thus, carrier density profile of the gain material 543 can be well controlled to satisfy corresponding application for a broad range of optical signal powers.

It can be derived from rate equations that small clamped carrier densities are required to maintain linear gain for large signal powers. However, small carrier density gives us small SNR and small linear gain. If the optical amplifier is used to generate maximum output power with maximum linear gain, one should clamp local carrier densities just below the critical levels of the corresponding local signal powers. If the optical amplifier is used as a optical signal equalizer to provide a constant output signal power, one could use the information carried by power monitoring currents and find the overall optical gain. Local carrier densities should also be clamped below the critical levels of the corresponding local signal powers to provide an overall linear gain.

Figure 6A:
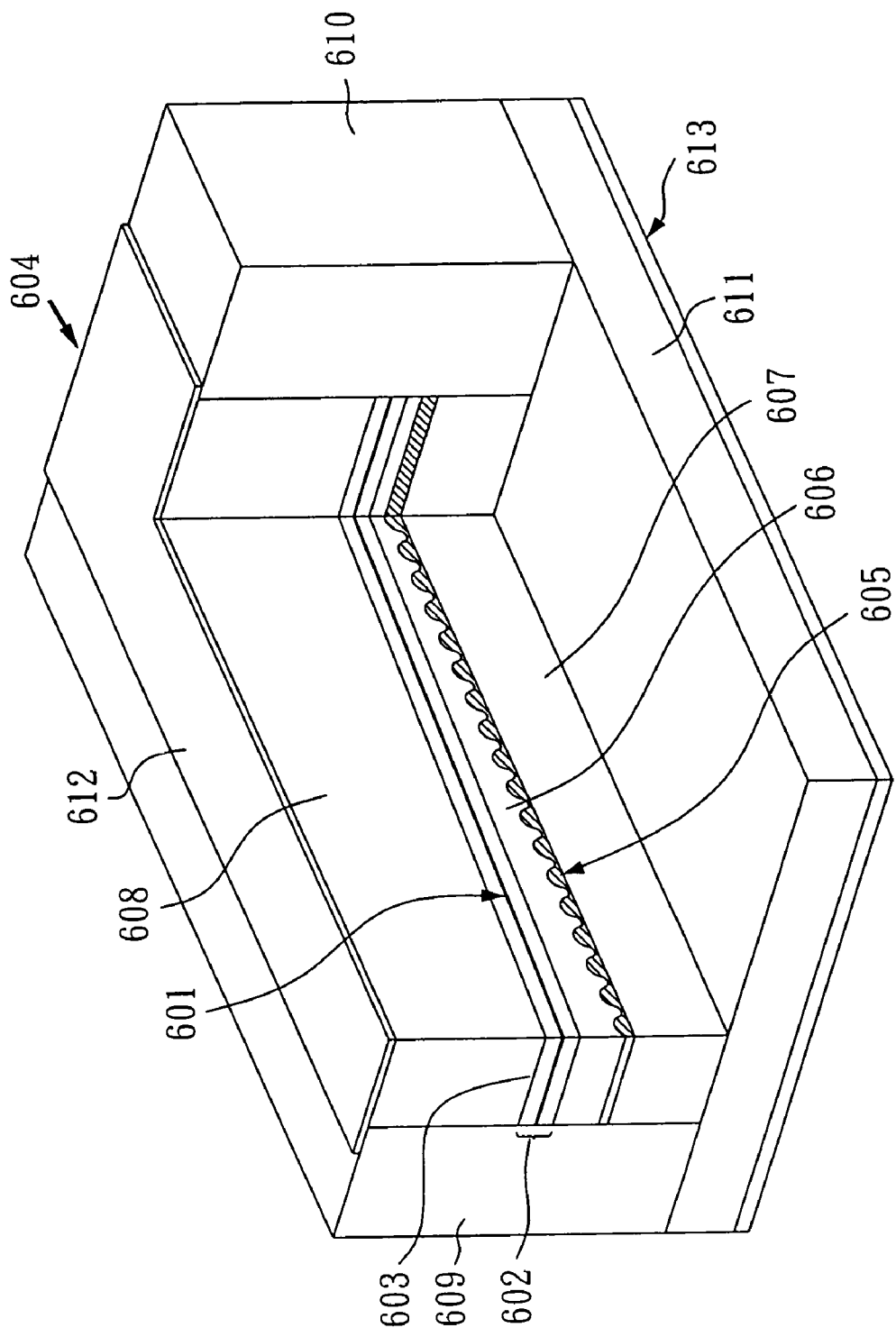
FIG. 6A is a partially broken-away perspective view of an embodiment of a semiconductor optical amplifier with longitudinal clamping lasers.
Figure 6B:
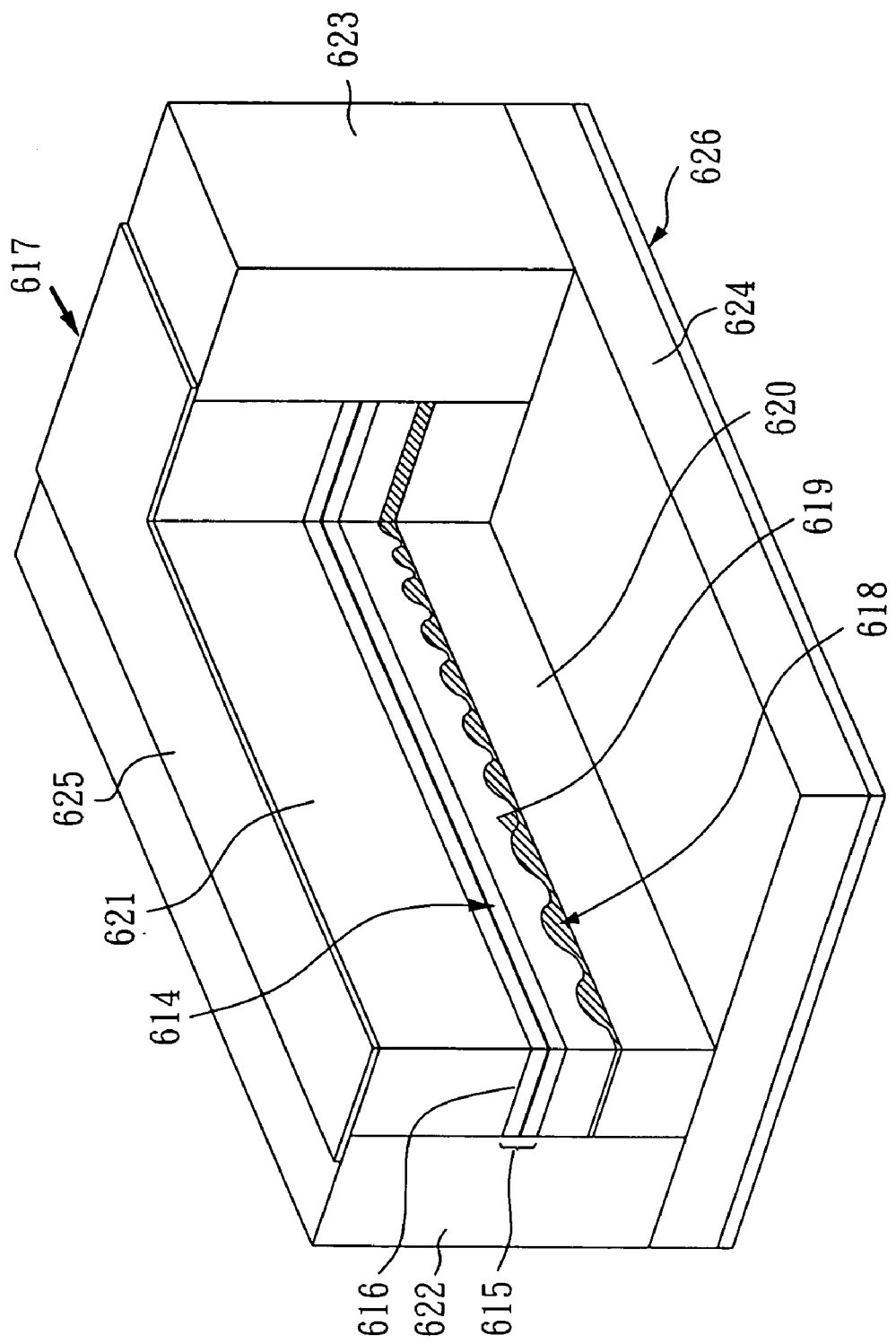
FIG. 6B is a partially broken-away perspective view of the structure of another semiconductor optical amplifier with longitudinal clamping lasers.
Figure 6C:
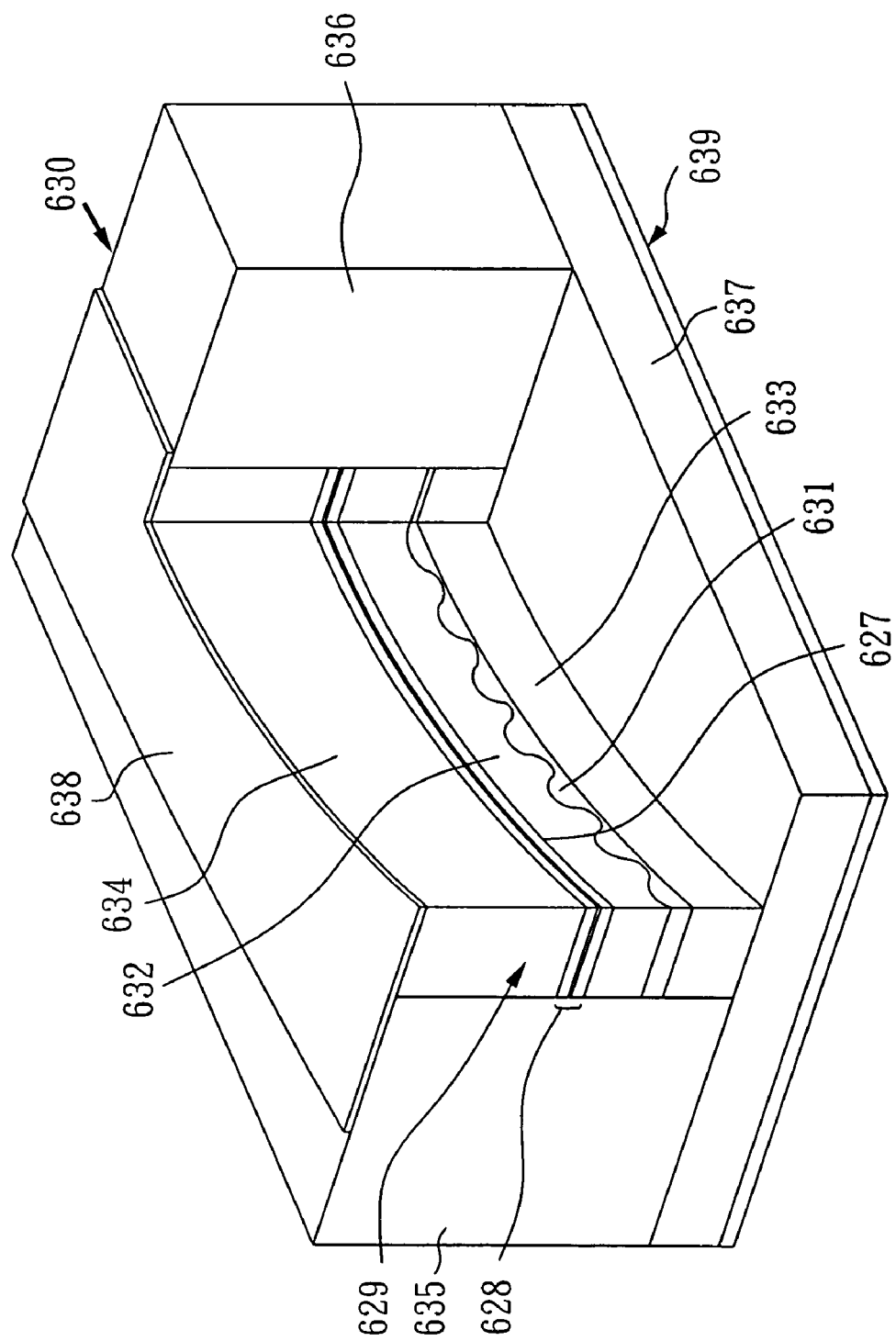
FIG. 6C is a partially broken-away perspective view of the structure of a further semiconductor optical amplifier with longitudinal clamping lasers.

Shown in FIGS. 6A–C are the partially broken-away perspective views of structures of semiconductor optical amplifiers with longitudinal clamping lasers. FIG. 6A is an embodiment of gain-clamped semiconductor optical amplifier derived from the structure shown in FIG. 3A. In FIG. 6A, the gain-clamped semiconductor optical amplifier comprises a gain material (e.g. multi-quantum well) 601, a slab waveguide region 602 (e.g. grading index structure), signal input and output facets 603 and 604, grating structure 605 (e.g. material index or gain variation), current blocking regions 609 and 610, wafer base 611, top and bottom electronic contacts 612 and 613. Grating structure 605 may be placed above or below waveguide region 602. The two regions are separated by spacing region 606. 607 and 608 are spacing regions above the wafer base 611 and below the top electronic contact 612. Signal input and output facets 603 and 604 are specially tailored to prevent internal reflection (e.g. anti-reflection coated, being angled to the waveguide, having window regions, or having beam expanders, etc.). The pumping current is injected into the semiconductor optical amplifier through the top and bottom electronic contacts 612 and 613. Current blocking regions 609 and 610, which can be air, or any low conductivity materials (e.g. polymer or semiconductor), confine the injected current flow through the gain material 601. The grating pitch of the grating structure 605 is uniform along the waveguide 602. The spacing region 606 between the waveguide 602 and grating 605 becomes thinner at positions closer to the signal output end 604. Optical signals guided by waveguide region 602 are subjected to an inclining grating coupling efficiency toward the signal output end. As the injected current is large enough to make local laser cavities, which are composed by distributed grating 605, oscillate, the clamped carrier densities descend toward the signal output end. To produce thickness varying spacing region 606, one could apply selective epitaxy growth technique.

FIG. 6B is an embodiment derived from the structure of FIG. 3B. In FIG. 6B, optical amplifier comprises a gain material (e.g. multi-quantum well) 614, a slab waveguide region 615 (e.g. grading index structure), signal input and output facets 616 and 617, grating structure 618 (e.g. material index or gain variation), current blocking regions 622 and 623, wafer base 624, top and bottom electronic contacts 625 and 626. Grating structure 618 may be placed above or below waveguide region 615. The two regions are separated by spacing region 619. 620 and 621 are spacing regions above the wafer base 624 and below the top electronic contact 625. Signal input and output facets 616 and 617 are specially tailored to prevent internal reflection (e.g. anti-reflection coated, being angled to the waveguide, having window regions, or having beam expanders, etc.). The pumping current is injected into the semiconductor optical amplifier through the top and bottom electronic contacts 625 and 626. Current blocking regions 622 and 623, which can be air, or any low conductivity materials (e.g. polymer or semiconductor), confine the injected current flow through the gain media 614. Local grating pitches of 618 are varying along the waveguide axis. Local grating pitches are designed such that local resonance frequencies, which are defined by local grating pitches, at positions closer to the signal output end are closer to the peak of gain spectrum of gain material 614. Local grating pitches closer to the signal output end 617 are getting smaller as shown in FIG. 6B. As the local resonance frequency is further away from the peak of material gain spectrum, higher carrier density is required to make local laser resonate.

As the injected current is large enough to make local laser cavities, which are defined by distributed grating 618, oscillate, the clamped carrier densities descend toward the signal output end. Variation of grating pitch can be achieved by using near field hologram or e-beam writing.

FIG. 6C is another embodiment derived from the structure of FIG. 3B. FIG. 6C is configured by similar elements as shown in FIG. 6B. The structure of FIG. 6C also comprises signal input and output facets 629 and 630, current blocking regions 635 and 636, wafer base 637, top and bottom electronic contacts 638 and 639. Instead of straight waveguide, FIG. 6C has a curved waveguide, which is composed by a gain material (e.g. multi-quantum well) 627, a slab waveguide region 628 (e.g. grading index structure), grating structure 631 (e.g. material index or gain variation), and spacing regions 632, 633, 634. Again, grating structure 631 may be placed above or below waveguide region 628.

Figure 6D:
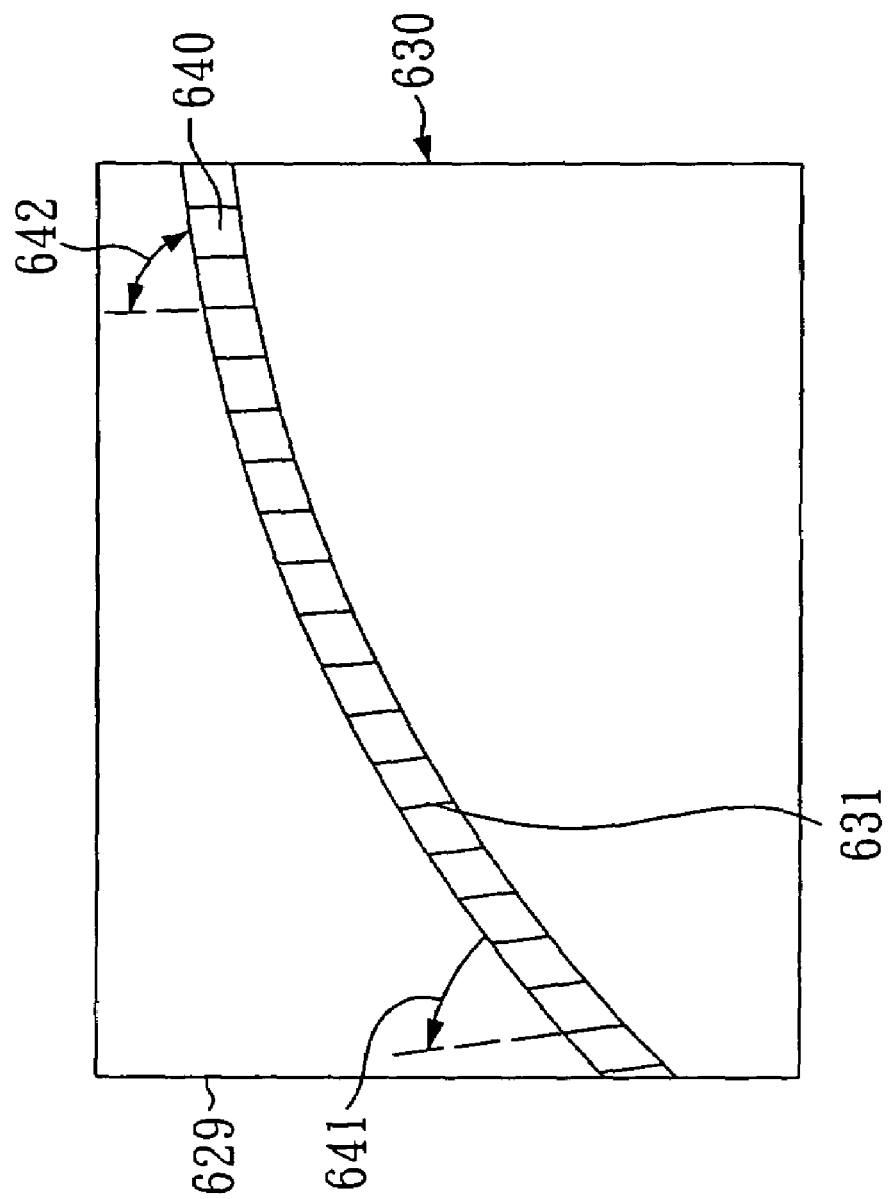
FIG. 6D shows a schematic top view of the structure of FIG. 6C.

To fabricate grating structures with varying grating pitches requires more sophisticate equipment than ones produce gratings with uniform grating pitch. The schematic top view of FIG. 6C device is shown in FIG. 6D. Grating strips 631 are parallel aligned and have uniform grating pitch. Grating strips are not necessary parallel to the signal input plane 629 or signal output plane 630. Curved waveguide mesa 640 is composed by gain material 627, slab waveguide region 628, grating structure 631, spacing regions 632, 633 and 634, as shown in FIG. 6C. Cross-angles between 631 and 640 vary along waveguide 640. Cross-angles of the portions 641, 642 are defined as $\theta_{641}$ and $\theta_{642}$ shown in FIG. 6D. For incident optical beams, which are guided by waveguide mesa 640, a smaller cross-angle corresponds to a larger grating pitch. As the device is biased, the local oscillation cavities with larger grating pitches will lase at lower local resonant frequency. For example, the resonant frequency near the portion 642 is higher than that near the portion 641. By arranging the grating/waveguide cross-angles, we can make the local resonate frequency near the signal output end closer to the peak frequency of the gain material. Thus, the local threshold lasing carrier densities near the signal input end are larger than that near the signal output end. Decline local carrier densities of the amplifier are then achieved.

Figure 7A:
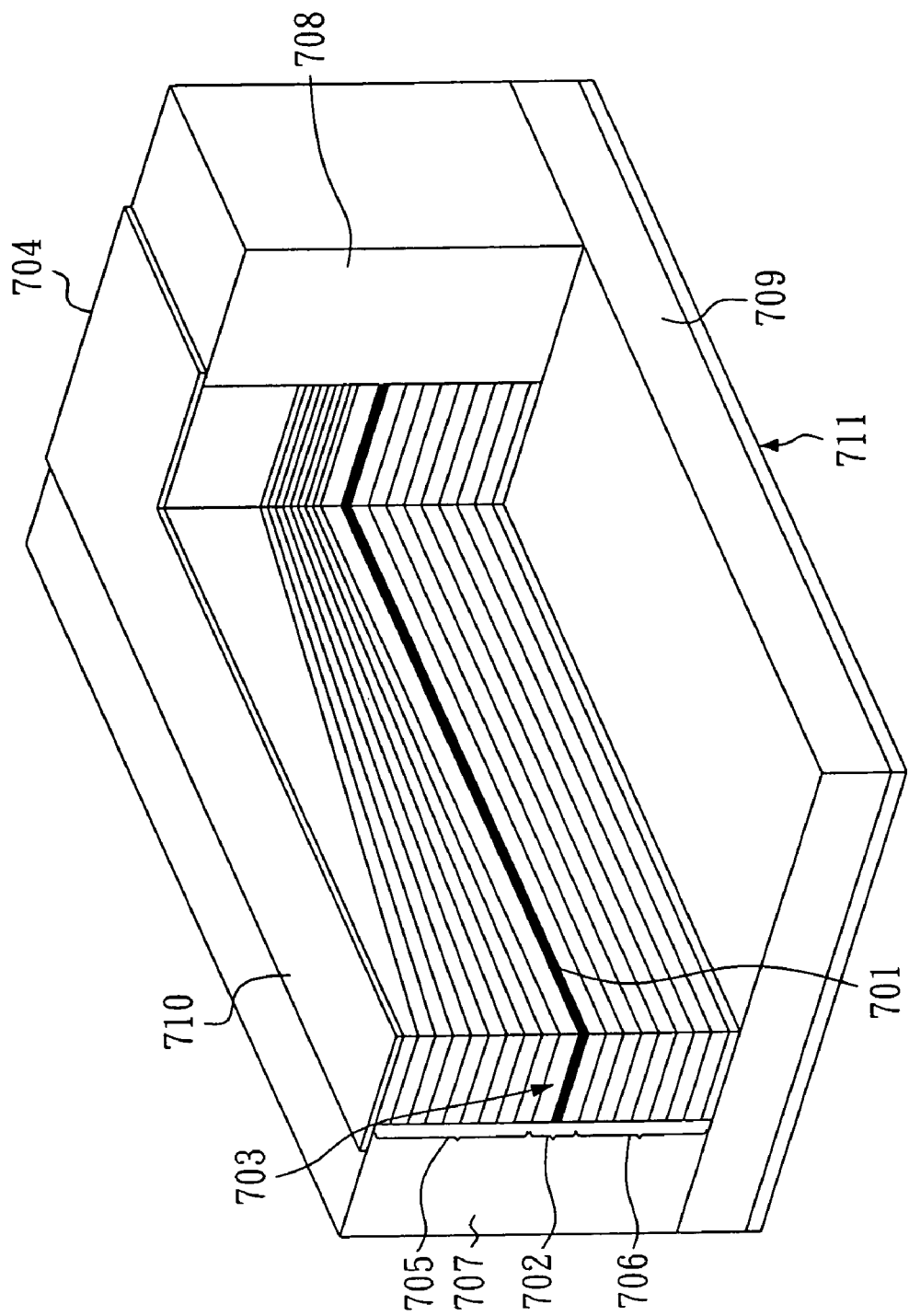
FIG. 7A is a partially broken-away perspective view of an embodiment of a VCSEL gain clamping semiconductor optical amplifier.
Figure 7B:
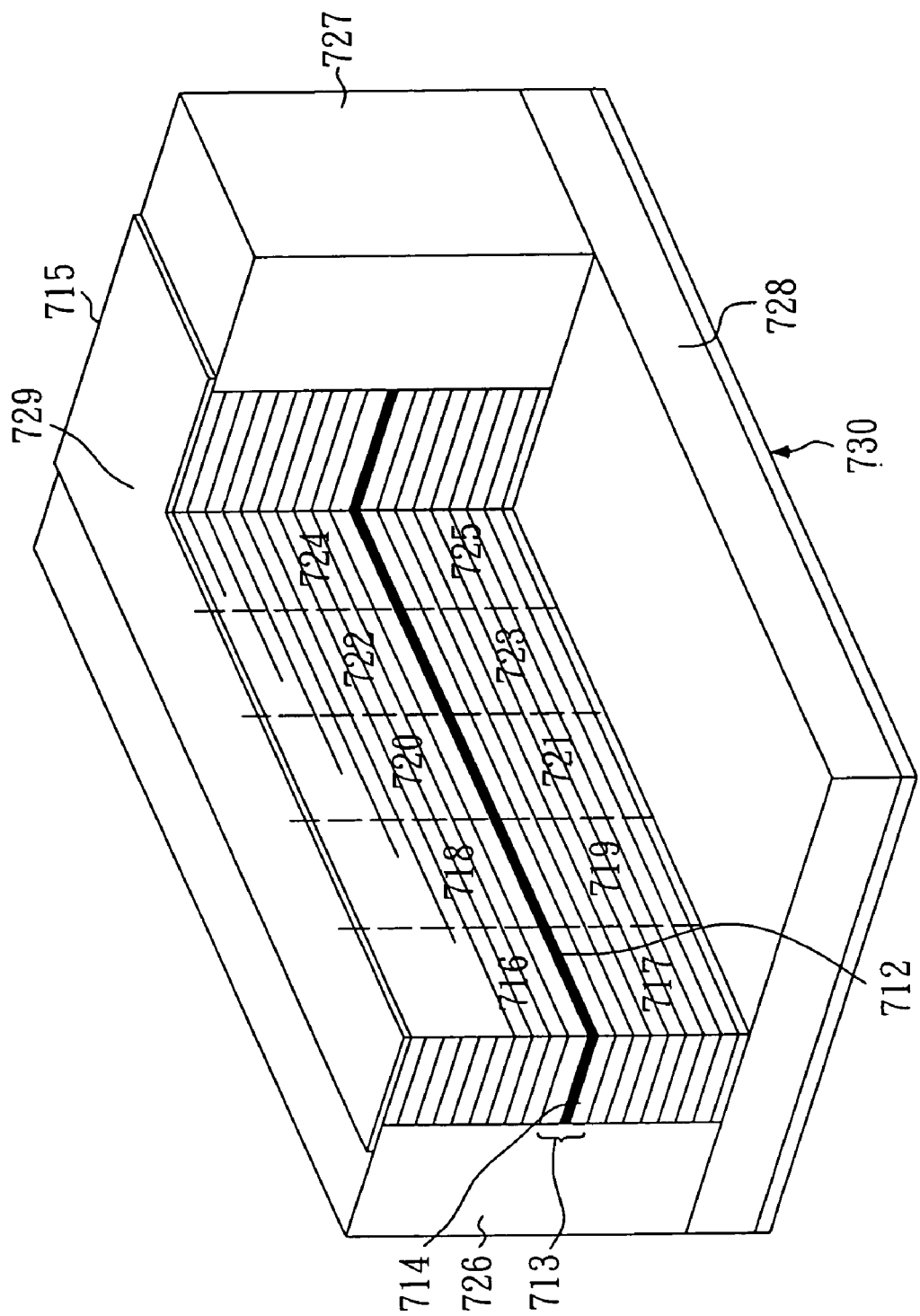
FIG. 7B is a partially broken-away perspective view of another embodiment of a VCSEL gain clamping semiconductor optical amplifier.
Figure 7C:
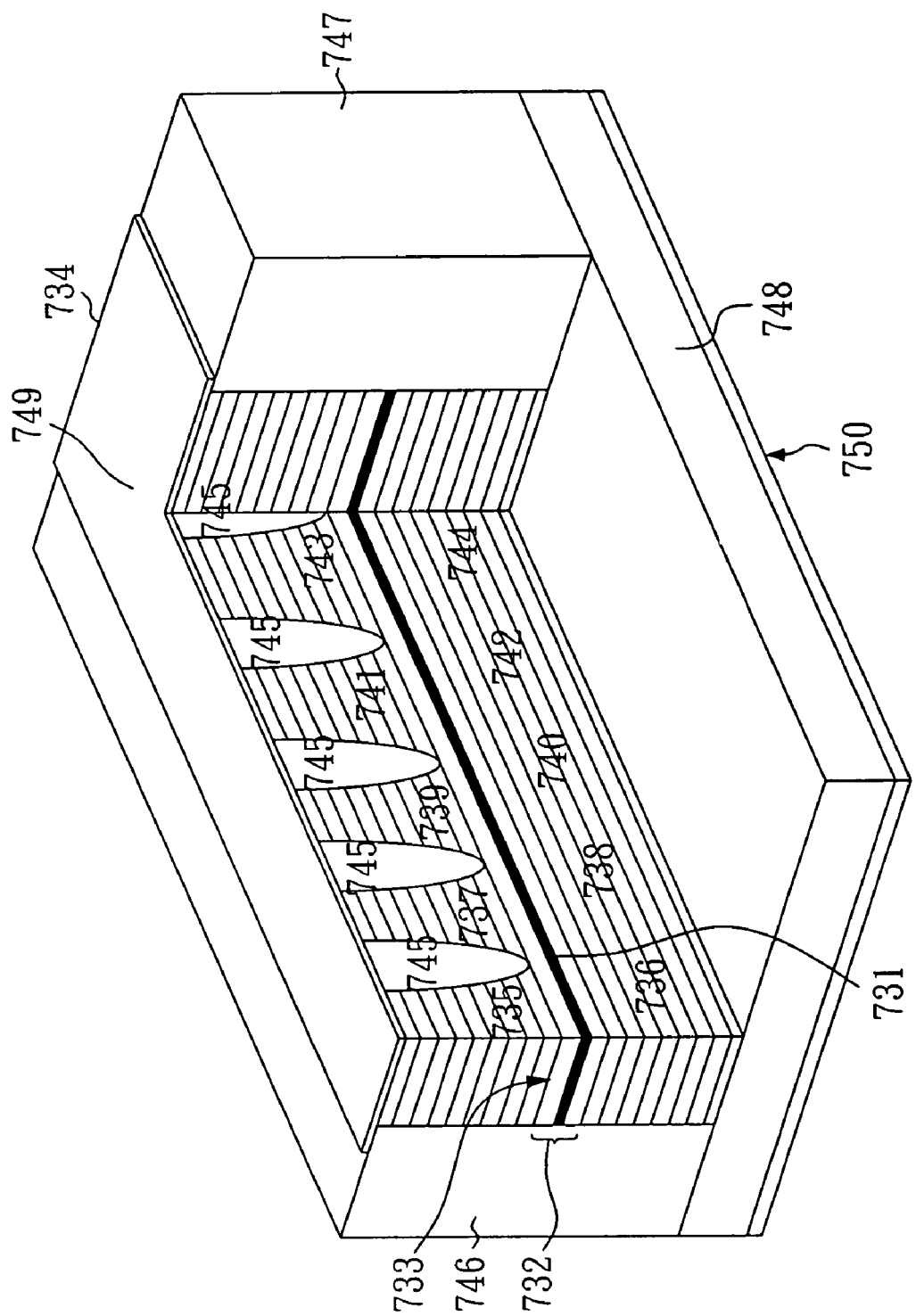
FIG. 7C is a partially broken-away perspective view of a further embodiment of a VCSEL gain clamping semiconductor optical amplifier.

Shown in FIGS. 7A–C are the partially broken-away perspective views of structures of VCSEL gain clamping semiconductor optical amplifier. FIG. 7A is an embodiment derived from the structures of FIGS. 4A and 4B. In FIG. 7A, the GC-SOA (gain-clamped semiconductor optical amplifier) comprises a gain material (e.g. multi-quantum well) 701, a slab waveguide region 702 (e.g. grading index structure), signal input and output facets 703 and 704, DBRs (distributed Bragg reflectors) 705 and 706, current blocking regions 707 and 708, wafer base 709, top and bottom bias electrodes 710 and 711. Signal input and output facets 703 and 704 are specially tailored to prevent internal reflection (e.g. anti-reflection coated, not perpendicular to the waveguide, having window regions, or having beam expanders, etc.). The pumping current is injected into the semiconductor optical amplifier through the top and bottom bias electrodes 710 and 711. Current blocking regions 707 and 708, which can be air, or any low conductivity materials (e.g. polymer or semiconductor), confine the injected current flow through the gain material 701. The injected current is large enough to make the laser cavities, which are defined by reflectors 705, 706 and gain material 701, oscillate. DBR 705 and/or 706 have layers thickness varying along the waveguide axis. The Bragg pitches of DBR 705 and 706 near the output facet 704 make the local lasing frequency closer to the peak of material gain spectrum. Thus, the clamped carrier densities ascend toward the signal output end. To produce pitch varying DBR layers, one could apply selective epitaxy growth technique.

Another embodiment of VCSEL GC-SOA is shown in FIG. 7B. The structure comprises a gain material (e.g. multi-quantum well) 712, a slab waveguide region 713, signal input and output facets 714 and 715, DBRs 716 to 725, current blocking regions 726 and 727, wafer base 728, top and bottom amplifier bias electrodes 729 and 730. Gain material 712, a slab waveguide region 713, signal input and output facets 714 and 715, blocking regions 726 and 727, wafer base 728, top and bottom amplifier bias electrodes 729 and 730 are the same as shown in FIG. 7A. DBRs 716/717, 718/719, 720/721, 722/723, 724/725 are used as the mirrors of local oscillation cavities. It is noted that the number of cavities is not limited to five as shown in FIG. 7B. Although DBR layers have the same grating pitch, upper and/or lower DBR regions closer to the signal output end have more layers. As the injected current large enough to make all local cavities lasing, local carrier densities are decrescently clamped.

To produce stair-like DBR regions, one could uniformly grow many layers of DBRs, and then sequentially etch away selected layers. Selective area etch is an alternative method, which can produce a DBR region with continuous tilt using single etch step.

Another embodiment of VCSEL GC-SOA is shown in FIG. 7C. The structure comprises a gain material (e.g. multi-quantum well) 731, a slab waveguide region 732, signal input and output facets 733 and 734, DBR regions 735 to 744, longitudinal current blocking regions 745, transverse current blocking regions 746 and 747, wafer base 748, top and bottom amplifier bias electrodes 749 and 750.

Gain material 731, a slab waveguide region 732, signal input and output facets 733 and 734, blocking regions 746 and 747, wafer base 748, top and bottom amplifier bias electrodes 749 and 750 are as described in FIG. 7A. Longitudinal current blocking regions 745, which can be placed above and/or below gain material 731, confine the injected current to flow into the portions of the gain material 731 corresponding to the laser cavities. Current blocking regions 745 also separate the upper and/or lower DBR layers and define the apertures of laser cavities, which are comprised by DBR mirror pairs 735/736, 737/738, 739/740, 741/742, 743/744. It is noted that the number of cavities is not limited to five as shown in FIG. 7C. The apertures of laser cavities are getting larger toward the signal output end 734. Larger lasing cavities have more transverse lasing modes and carrier densities are clamped at lower level. As the injected current large enough to make all local cavities lasing, local carrier densities are decrescently clamped.

Figure 8:
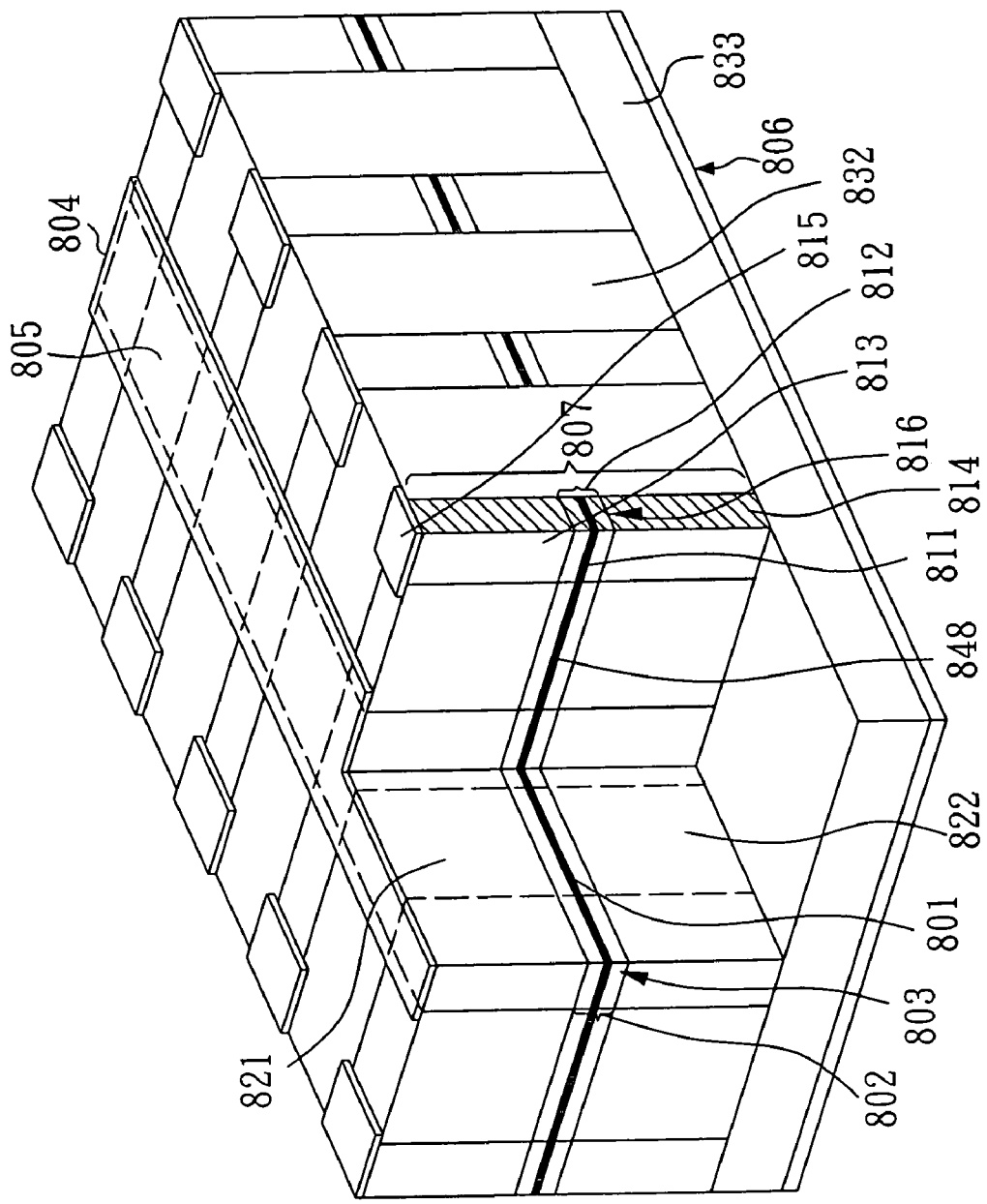
FIG. 8 is a partially broken-away perspective view of the structure of a gain-clamped semiconductor optical amplifier with adjustable gain/loss wings.

Shown in FIG. 8 is a partially broken-away perspective view of the structure of a GC-SOA with adjustable gain/loss wings. The structure includes a signal amplifying mesa and several cross-cavity gain clamping lasers. In FIG. 8, the GC-SOA consists of a signal amplifying gain material (e.g. multi-quantum well) 801, a slab waveguide region 802 for amplified optical signal, signal input and output facets 803 and 804, top and bottom bias electrodes 805 and 806 of signal amplifying waveguide, wafer base 833, and cross-cavity gain clamping lasers 807. The signal amplifying active mesa including the signal amplifying gain material 801 and the slab waveguide region 802 indicates the middle region below the top bias electrode 805. Current blocking regions 821 and 822, which electrically isolate the injection currents amplified signal and cross-cavity gain clamping lasers, are placed between the slab waveguide region 802 and the top amplifier bias electrode 805 and the wafer base 833, respectively.

Each cross-cavity gain-clamping laser 807, which acts as a combination of a mirror and a gain/loss wing, comprises a gain/loss material 811, slab waveguide 812, and a wing bias electrode 815. Spacing regions 813 and 814 are positioned between the waveguide 812 and the wing bias electrode 815 and the wave base 833, respectively. The mirror 816 of the cross-cavity gain clamping laser 807 is defined by the interfaces between the combination of the portions of the lased 807 and the air.

The cross-cavity gain clamping lasers 807 can be made of bulk semiconductor materials or multi-quantum wells. The material composition and/or thickness of the multi-quantum wells of the wings can be all different. Selective area epitaxy technique can be applied to achieve active region variation. Gain or loss coefficients of the wing portion of the laser 807 can be controlled by electronic bias condition applied to the wing bias electrode 815.

Slab waveguides in-between wing gain/loss waveguide 812 and signal amplifying waveguide 802, for example 848, can be active or passive. Transitions of slab waveguides should be made as smooth as possible to minimize unnecessary optical reflection.

The mirrors 816 of cross-cavity gain clamping lasers 807 can be air post grating structure, cleaved crystal surface or any other reflecting structures with or without optical coatings.

Cross-cavity gain clamping lasers 807 share a part of the signal amplifying gain material 801. As one cross-cavity gain clamping laser is biased above threshold, the gain/loss coefficient of all active regions including the gain/loss wing regions and the cross portion of the amplifying gain material are related to satisfy the round trip condition of the resonant cavity. Let us take one cross-cavity gain-clamping laser as example. The carrier density at intersection region of the active gain region and the cross-cavity clamping lasers 807 can be adjusted by the bias condition of the wing bias electrodes 815 to satisfy the round trip condition. Exact carrier density of this region can be calculated by solving the round trip condition, and the rate equation of the amplifying gain material and gain/loss wing regions. In general, the carrier density of the intersection portion is lowered as we control electrical bias to the wing bias electrode 815 so as to increase the gain coefficients of the corresponding gain material 811.

Because of carrier diffusion, carrier densities of amplifying active waveguide at position in-between the intersection regions are influenced by the carrier densities of adjacent intersection regions. As that spacing regions 832 are narrow enough, carrier densities of amplifying active waveguide at position in-between the intersection regions can be controlled by wing gain/loss bias. Therefore, carrier densities of the whole amplifying waveguide can be clamped and controlled. In order to make the carrier densities decline toward signal output end, spacing region 832 should be designed wide enough to allow the carrier densities of adjacent wing gain/loss regions have necessary level of difference. However, the spacing region 832 should be narrow enough to make positions in-between the intersection regions have carrier densities in-between carrier densities of the adjacent two intersection regions. By properly designing the structure of wing gain/loss region of the laser 807 and the bias condition of wing bias electrode 815, the carrier densities along the amplifying waveguide can be well decliningly clamped toward the signal output end.

Figure 9:
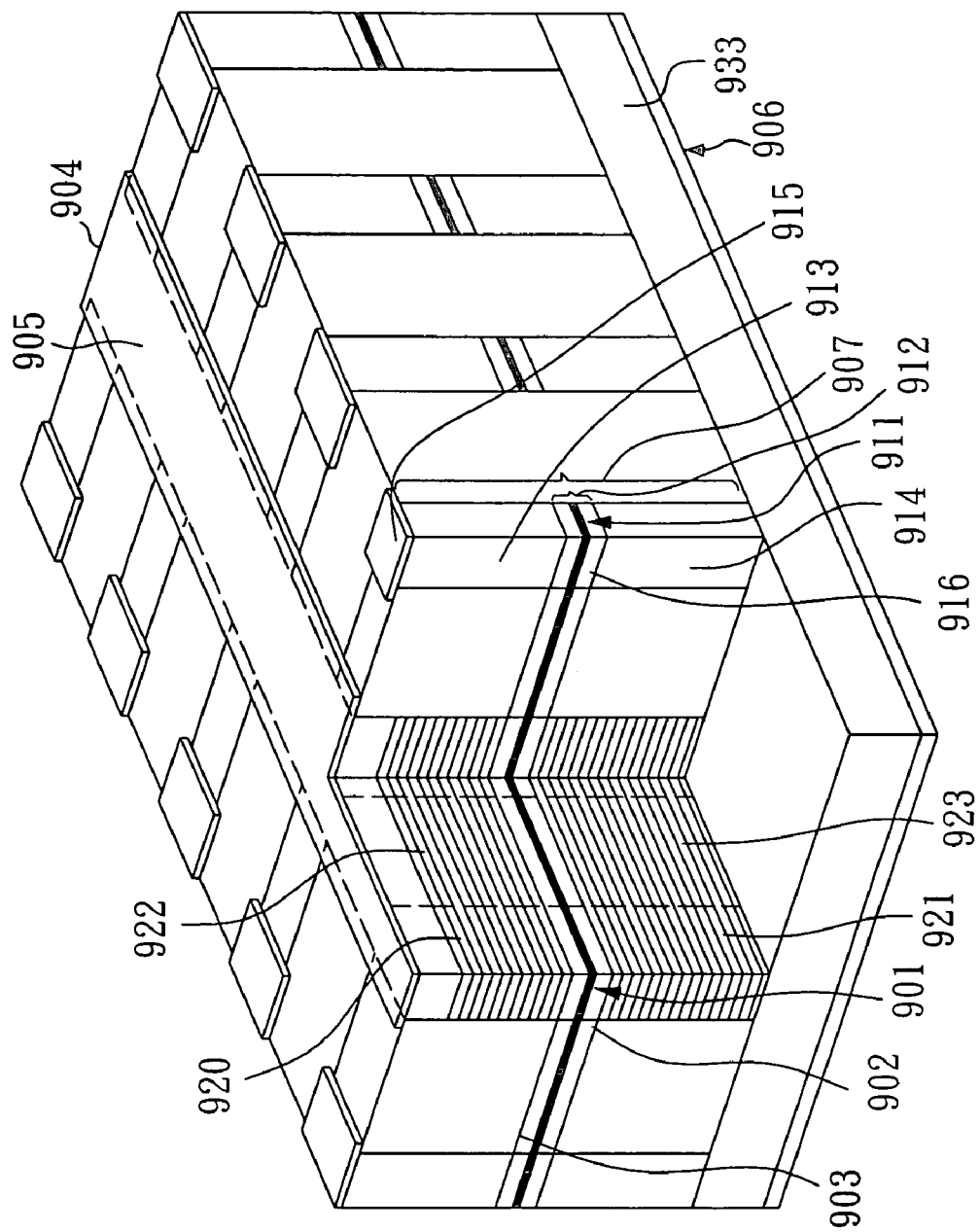
FIG. 9 is a partially broken-away perspective view of the structure of a gain-clamped semiconductor optical amplifier.

Shown in FIG. 9 is a partially broken-away perspective view of the structure of a GC-SOA with double gain clamping laser systems. The structure of FIG. 9 is an improvement from that of FIG. 8. One clamping laser system is the surface emission lasers, which have short cavity length and can response to fast input signal perturbation and still clamp the carrier densities of amplifying waveguide at stable level. Another clamping laser system is a series of gain/loss wing cavities, which allow us to control the clamping carrier density profile by adjust the bias condition of wing gain/loss electrodes. In FIG. 9, similar reference numbers indicate the same portions as shown in FIG. 8. The difference between the structures of FIGS. 8 and 9 is that the structure shown in FIG. 9 further comprises top and/or bottom DBR mirrors 922 and 923 of vertical cavity surface emitting gain clamping lasers.

As mentioned above, vertical laser cavities are formed by top and bottom DBR layers 922 and 923, and gain media 901 in-between. Carrier density response time of a clamping laser cavity is in the order of its round trip time. Since cavities length of the vertical lasers can be made very small (in the order of micro meter or less), the carrier density response time of vertical cavities are in the order of $10^{-14}$ second. Fast carrier density response time results in fast clamping action.

Portions of the signal amplifying gain material 901 are shared by gain/loss wing lasers, and the vertical cavity lasers. These portions of the gain material are called as "double clamping active regions". As both the vertical cavity surface emitting lasers and gain/loss wing lasers are biased above threshold, the carrier densities at double clamping active regions are clamped by both the gain/loss wing cavities and vertical cavities. The carrier densities of double clamping active regions are determined by the round trip condition of the two clamping laser systems and the rate equations of the amplifying gain material. The clamping action time of double clamping active region is determined by the fastest clamping laser system, which is the vertical cavity. However, the clamped carrier densities can be controlled by wing bias electrodes of gain/loss wing lasers. By similar methods described for FIG. 8, a declining carrier density profile toward signal out put end can be obtained.

Figure 10:
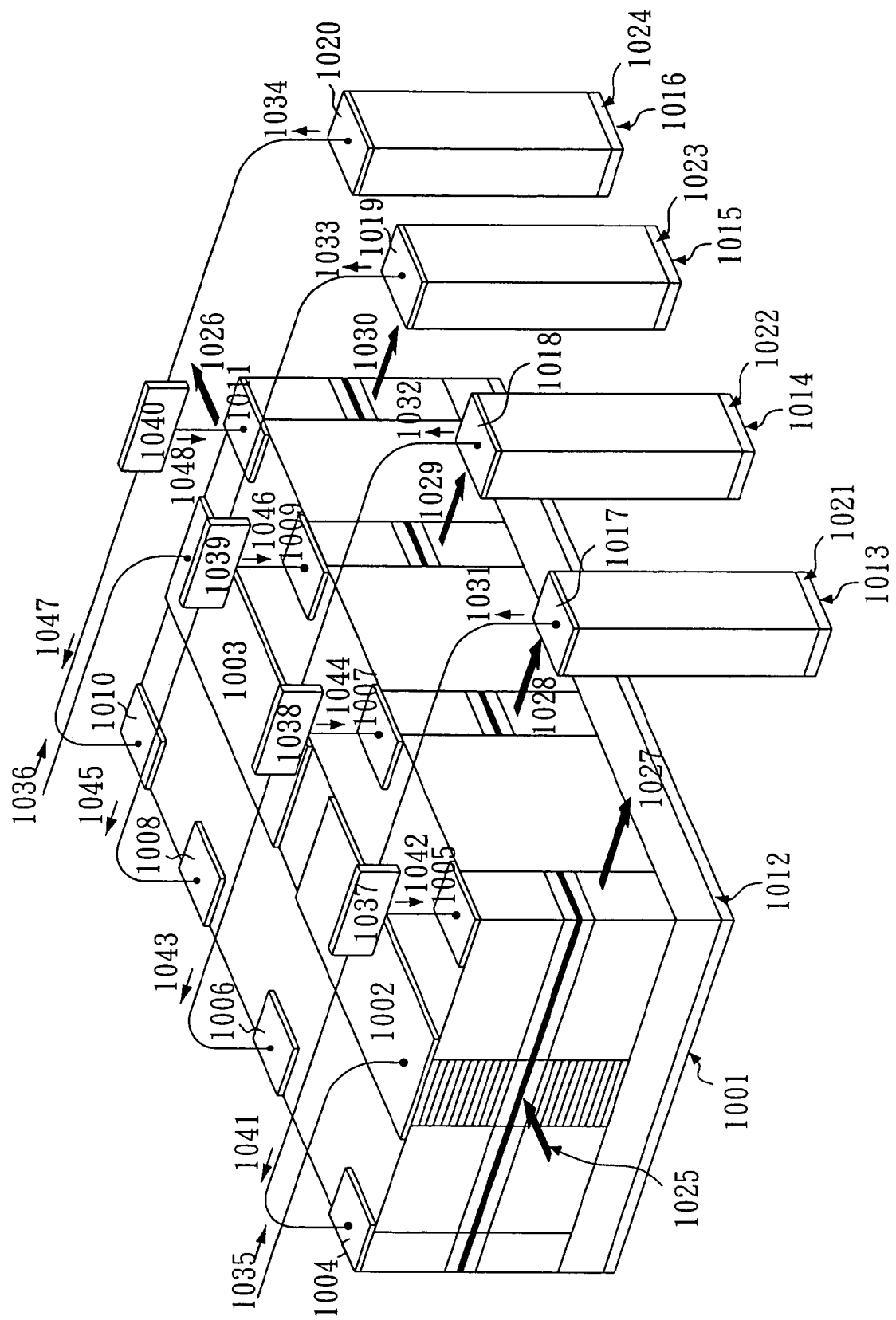
FIG. 10 shows an embodiment of a gain-clamped semiconductor optical amplifier derived from the structure of FIG. 5B.

FIG. 10 shows an embodiment derived from the semiconductor components version in FIG. 5B. In FIG. 10, device 1001 could be either GC-SOA with wing gain/loss clamping lasers as shown in FIG. 8 or GC-SOA with double clamping systems as shown in FIG. 9. GC-SOA 1001 comprises at least one, for example, two top bias electrodes 1002 and 1003, at least one pair of wing bias electrodes, as 1004 to 1011, and bottom electrode 1012. Optical detectors 1013 to 1016 could be separate devices, alternatively, they could be integrated in one device, or even integrated with the device 1001 to ease the photo detectors alignment task. Facets receiving optical power of detectors may not be perpendicular to the incident direction to prevent unnecessary reflection back to clamping laser cavities. Top electrodes 1017 to 1020 and bottom electrodes 1021 to 1024 may not different sides of the power receiving facets. Power index optical signals 1027 to 1030 are reverse signatures of local signal powers of the amplifying waveguide. Photon currents 1031 to 1034 provide local signal power informations to control circuits 1037 to 1040. Amplifying waveguide pumping currents 1035 and 1036 could be controlled by external circuits or by the one of the control circuits 1037 to 1040. For example, control circuit 1037 could use the power level information carried by photo current 1031 to control the bias 1035 of signal input end electrode 1002 to optimize SNR. Similarly, control circuit 1040 could use the power level information carried by photo current 1034 to control the bias 1036 of signal output end electrode 1003 to avoid power saturation at the output end.

Figure 11:
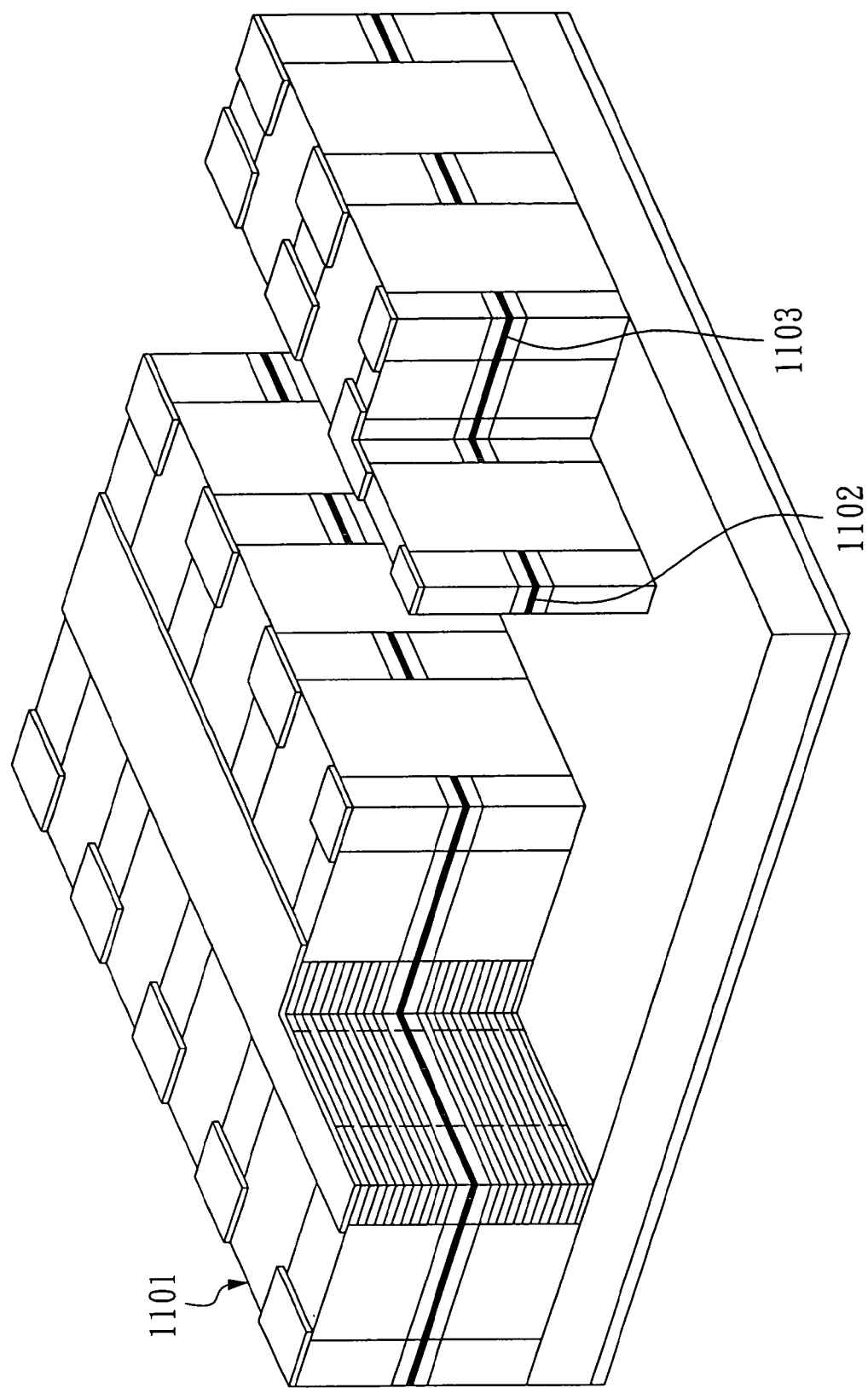
FIG. 11 shows another embodiment similar to the structure in FIG. 10.

The structure shown in FIG. 11 is similar to that in FIG. 10. The main difference is that the structure shown in FIG. 11 has amplifiers provided between the device 1101 and the detectors 1103. The relative descriptions concerning the operations of the amplifier can be referred to the descriptions about FIG. 5A. Device 1101 could be either GC-SOA with wing gain/loss clamping lasers of FIG. 8 or GC-SOA with double clamping systems of FIG. 9. As mentioned above, numeral 1102 indicates optical amplifiers, and 1103 indicate photo detectors. All components are integrated in one device. Thus, optical alignment is achieved by semiconductor lithography processing.

While embodiments of the present invention are illustrated and described, various modifications and improvements can be made by persons skilled in this art. The embodiments of the present invention are therefore described for illustration rather than restriction. It is intended that the present invention may not be limited to the particular forms as illustrated, and that all modifications and variations can be made without departing from the spirit and scope of the present invention. The scope of the present invention is defined as the appended claims.

What is claimed is:

1. An optical amplifier for amplifying optical signals, said optical amplifier having an input facet and an output facet, said optical amplifier comprising:

a gain medium defining an amplifier axis; and a plurality of gain clampers disposed along the amplifier axis to control the local carrier density distribution of the gain medium of the optical amplifier, each of said gain clampers being constructed by grating structures arranged in an in-axis form along the amplifier axis, and the gain clamping efficiencies of the grating structures declining from the input facet to the output facet, wherein the more the grating structures approach the output facet, the larger the magnitude of structure discontinuity of the grating structures is, and wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal.

2. The optical amplifier as claimed in claim 1, wherein said structure discontinuity of the grating structures is realized by the index difference of the grating structures.

3. The optical amplifier as claimed in claim 1, wherein the optical amplifier is a semiconductor optical amplifier, said semiconductor optical amplifier comprising:

a slab waveguide region sandwiching said gain medium, said grating structure placed close to said slab waveguide region for defining in-axis laser cavities;

electronic contacts placed on and under the semiconductor optical amplifier for directing pumping currents into the semiconductor optical amplifier; and a wafer base for supporting the respective components, wherein the magnitude of discontinuity of the grating structure is constructed so that the more the grating structure approaches the output facet, the larger the magnitude of discontinuity of the grating structure is.

4. An optical amplifier for amplifying optical signals, said optical amplifier having an input facet and an output facet, said optical amplifier comprising:

a gain medium defining an amplifier axis; and a plurality of gain clampers disposed alone the amplifier axis to control the local carrier density distribution of the gain medium of the optical amplifier, each of said gain clampers being constructed by grating structures arranged in an in-axis form along the amplifier axis, and the gain clamping efficiencies of the grating structures declining from the input facet to the output facet, wherein the more the grating structures approach the output facet, the more the oscillation wavelength of the grating structures matches the peak of the spectrum of the gain medium, thereby realizing declining effect of the gain clamping efficiencies of the grating structures and wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal.

5. The optical amplifier as claimed in claim 4, wherein the matching of the oscillation wavelength of the grating structures and the peak of the spectrum of the gain medium is realized by said grating structures disposed with varying pitches.

6. The optical amplifier as claimed in claim 4, wherein the optical amplifier is a semiconductor optical amplifier, said semiconductor optical amplifier comprising:

a slab waveguide region sandwiching said gain medium, said grating structure placed close to said slab waveguide region for defining in-axis laser cavities;

electronic contacts placed on and under the semiconductor optical amplifier for directing pumping currents into the semiconductor optical amplifier; and a wafer base for supporting the respective components, wherein the grating structure is constructed so that the local resonate frequencies of the gratings gradually approach the peak frequency of the gain medium toward the output facet.

7. The optical amplifier as claimed in claim 6, wherein the waveguide is straight, and the grating pitches of the grating structure vary.

8. The optical amplifier as claimed in claim 6, wherein the varying grating pitches are realized by arranging the waveguide with curved profile.

9. An optical amplifier for amplifying optical signals, said optical amplifier having an input facet and an output facet, said optical amplifier comprising:

a gain medium defining an amplifier axis;

a plurality of gain clampers disposed along the amplifier axis to control the local carrier density distribution of the gain medium of the optical amplifier, each of said gain clampers being constructed by laser cavities, each of the laser cavities being defined by a pair of mirrors disposed beside the gain medium, said mirrors facing each other and arranged in an off-axis form along the amplifier axis;

wing structures disposed between each of said mirrors and the gain medium, respectively, wherein the optical gain coefficient of the wing structures increases from the input facet to the output facet, thereby making the clamped local carrier densities of the gain medium of the optical amplifier decline to satisfy the round trip condition of the corresponding laser cavities; and a series of longer laser cavities with wing structures inserted thereinto to realizing the declining effect of the local carrier densities, and a series of shorter laser cavities containing no wing structures, to determine the carrier response time, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal.

10. The optical amplifier as claimed in claim 9, wherein the optical amplifier is a semiconductor optical amplifier, said semiconductor optical amplifier comprising;

a slab waveguide region sandwiching said gain medium;

distributed Bragg reflector (DBR) regions disposed beside the slab waveguide region for acting as mirrors to define off-axis surface emission laser cavities;

a plurality of off-axis gain-clamping lasers, whose laser mirrors are composed by crystal surfaces, each off-axis gain-clamping laser comprising at least one wing structures, each wing structure having bias electrodes so that the gain coefficient of wing structure is controlled by the biasing electrodes;

electronic contacts placed on and under the semiconductor optical amplifier for directing pumping currents into the semiconductor optical amplifier; and a wafer base for supporting the respective components, wherein the surface emission lasers defining narrow cavities provide fast response time, and the wing structured off-axis laser cavities control the carrier density distribution of the optical amplifier.

11. An optical amplifier for amplifying optical signals, said optical amplifier having an input facet and an output facet, said optical amplifier comprising:

a gain medium defining an amplifier axis; and a plurality of gain clampers disposed along the amplifier axis to control the local carrier density distribution of the gain medium of the optical amplifier, each of said gain clampers being constructed by laser cavities, each of the laser cavities being defined by a pair of mirrors disposed beside the gain medium, said mirrors facing each other and arranged in an off-axis form along the amplifier axis; and photon detectors for receiving output optical powers from said gain clamping laser cavities, wherein the photon currents output by the photon detectors indicate signal power levels at the portions of the gain medium corresponding to said gain clamping laser cavities, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal.

12. The optical amplifier as claimed in claim 11, further comprising amplifiers to amplify the optical powers from said gain clamping laser cavities and transmit the amplified optical powers to said photon detectors.

13. The optical amplifier as claimed in claim 11, wherein the photon currents of the photon detectors are used to control the gain coefficient distribution of the optical amplifier.

14. The optical amplifier as claimed in claim 11, further comprising wing structures inserted into the laser cavities, wherein the photon currents are used to control the gain coefficients of the wing structures, thereby making the photon currents control the distribution of the gain clamped carrier density of the optical amplifier.

15. The optical amplifier as claimed in claim 12 or 13, wherein said optical amplifier is used as an optical signal equalizer to provide constant output power independent of input signal power level.

16. An optical amplifier for amplifying optical signals, said optical amplifier having an input facet and an output facet, said optical amplifier comprising:

a gain medium defining an amplifier axis; and a plurality of gain clampers disposed along the amplifier axis to control the local carrier density distribution of the gain medium of the optical amplifier, each of said gain clampers being constructed by grating structures arranged in an in-axis form alone the amplifier axis, and the gain clamping efficiencies of the grating structures declining from the input facet to the output facet, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal, and wherein the optical amplifier is a semiconductor optical amplifier, said semiconductor optical amplifier comprising:

a slab waveguide region sandwiching said gain medium, said grating structure placed close to said slab waveguide region for defining in-axis laser cavities;

electronic contacts placed on and under the semiconductor optical amplifier for directing pumping currents into the semiconductor optical amplifier; and a wafer base for supporting the respective components, wherein the grating pitches of the grating structure are uniform, and the grating structure is getting closer to the slab waveguide region toward the output facet.

17. An optical amplifier for amplifying optical signals, said optical amplifier having an input facet and an output facet, said optical amplifier comprising:

a gain medium defining an amplifier axis; and a plurality of gain clampers disposed along the amplifier axis to control the local carrier density distribution of the gain medium of the optical amplifier, each of said gain clampers being constructed by laser cavities, each of the laser cavities being defined by a pair of mirrors disposed beside the gain medium, said mirrors facing each other and arranged in an off-axis form along the amplifier axis, and wherein the products of reflectivities of the peak wavelength of the amplifier gain spectrum of the mirror pairs of the gain clamping laser cavities increase toward the output facet, thereby making the gain clamping efficiencies of the laser cavities decline from the input facet to the output facet, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal, and wherein the optical amplifier is a semiconductor optical amplifier, said semiconductor optical amplifier comprising:

a slab waveguide region sandwiching said gain medium;

distributed Bragg reflector (DBR) regions disposed beside the slab waveguide region for acting as mirrors to define off-axis surface emission laser cavities;

electronic contacts placed on and under the semiconductor optical amplifier for directing pumping currents into the semiconductor optical amplifier; and a wafer base for supporting the respective components, wherein at least one DBR region has a thickness varying along the waveguide region, and the DBR mirrors are constructed so that the local resonate frequency of the DBR mirrors gradually approaches to the peak frequency of the gain medium toward the output facet.

18. An optical amplifier for amplifying optical signals, said optical amplifier having an input facet and an output facet, said optical amplifier comprising:

a gain medium defining an amplifier axis; and a plurality of gain clampers disposed alone the amplifier axis to control the local carrier density distribution of the gain medium of the optical amplifier, each of said gain clampers being constructed by laser cavities, each of the laser cavities being defined by a pair of mirrors disposed beside the gain medium, said mirrors facing each other and arranged in an off-axis form along the amplifier axis, and wherein the products of reflectivities of the peak wavelength of the amplifier gain spectrum of the mirror pairs of the gain clamping laser cavities increase toward the output facet, thereby making the gain clamping efficiencies of the laser cavities decline from the input facet to the output facet, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal, and wherein the optical amplifier is a semiconductor optical amplifier, said semiconductor optical amplifier comprising:

a gain medium having input and output facets;

a slab waveguide region sandwiching said gain medium;

distributed Bragg reflector (DBR) regions disposed as pairs beside the slab waveguide region for acting as mirrors to define off-axis surface emission laser cavities;

electronic contacts placed on and under the semiconductor optical amplifier for directing pumping currents into the semiconductor optical amplifier; and a wafer base for supporting the respective components, wherein the DBR mirror pairs are constructed so that the products of reflectivity of the DBR mirror pairs decline from the input facet to the output facet.

19. The semiconductor optical amplifier as claimed in claim 18, wherein at least one DBR region has the number of the DBR layers varying along the waveguide region.

20. An optical amplifier for amplifying optical signals, said optical amplifier having an input facet and an output facet, said optical amplifier comprising:

a gain medium defining an amplifier axis;

a plurality of gain clampers disposed along the amplifier axis to control the local carrier density distribution of the gain medium of the optical amplifier, each of said gain clampers being constructed by laser cavities, each of the laser cavities being defined by a pair of mirrors disposed beside the gain medium, said mirrors facing each other and arranged in an off-axis form along the amplifier axis; and wing structures disposed between each of said mirrors and the gain medium, respectively, wherein the optical gain coefficient of the wing structures increases from the input facet to the output facet, thereby making the clamped local carrier densities of the gain medium of the optical amplifier decline to satisfy the round trip condition of the corresponding laser cavities, wherein the whole carrier density distribution of the optical amplifier is controlled by the gain clampers, the whole carrier density distribution of the optical amplifier declines from the input facet to the output facet, and the resulting local saturation photon density is larger than the local photon density of the amplified optical signal, and wherein the optical amplifier is a semiconductor optical amplifier, said semiconductor optical amplifier comprising:

a slab waveguide region disposed along said gain material;

electronic contacts placed on and under the semiconductor optical amplifier for directing pumping currents into the semiconductor optical amplifier;

a plurality of off-axis gain-clamping lasers, whose laser mirrors are composed by crystal surfaces, each off-axis gain-clamping laser comprising at least one wing structures, each wing structure having bias electrodes so that the gain coefficient of the wing structure is controlled by the biasing electrodes; and a wafer base for supporting the respective components, wherein the cross-cavity gain-clamping lasers are controlled so that the gain coefficient of the wing structures increases from the input facet to the output facet, making the clamped local densities of the gain materials of the optical amplifiers declining toward the output facet.

21. The optical amplifier as claimed in claim 20, wherein the laser mirrors are coated with high refection materials to enhance the gain clamping efficiency.

22. The optical amplifier as described in claim 20, further comprising detectors for receiving output optical powers from said gain clamping laser cavities.

23. The optical amplifier as described in claim 22, further comprising semiconductor optical amplifiers for amplifying the optical powers from said gain clamping laser cavities and transmitting the amplified optical powers to said detectors.

24. The optical amplifier as described in claim 22, wherein the photo currents of the detectors are used to control the bias of the wing electrodes and the bias of optical amplifier to adjust the gain coefficient of the optical amplifier.

* * * * *